(12) United States Patent
Tsuchiyama et al.

(10) Patent No.: US 10,809,470 B2
(45) Date of Patent: Oct. 20, 2020

(54) ELECTRONIC DEVICE AND METHOD OF MANUFACTURING THE SAME

(71) Applicant: RENESAS ELECTRONICS CORPORATION, Tokyo (JP)

(72) Inventors: Kazuaki Tsuchiyama, Tokyo (JP); Motoo Suwa, Tokyo (JP); Ryuichi Oikawa, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/410,733

(22) Filed: May 13, 2019

(65) Prior Publication Data

US 2019/0377143 A1 Dec. 12, 2019

(30) Foreign Application Priority Data

Jun. 7, 2018 (JP) ................................ 2018-109583

(51) Int. Cl.
*G02B 6/42* (2006.01)
*H01S 5/042* (2006.01)

(52) U.S. Cl.
CPC .......... *G02B 6/4279* (2013.01); *H01S 5/0427* (2013.01)

(58) Field of Classification Search
None
See application file for complete search history.

(56) References Cited

U.S. PATENT DOCUMENTS 7,056,036 B2 6/2006 Keh et al.
2018/0310397 A1* 10/2018 Noguchi ................ H05K 1/025

FOREIGN PATENT DOCUMENTS

JP 2004-214651 A 7/2004

* cited by examiner

*Primary Examiner* — Jerry Rahll
(74) *Attorney, Agent, or Firm* — McDermott Will & Emery LLP

(57) ABSTRACT

A performance of an electronic device is improved. An optical transceiver (electronic device) includes a semiconductor device electrically connected to a transmission line. In this semiconductor device, a resistor is arranged between a wiring electrically connected to the transmission line and a semiconductor chip having a semiconductor laser formed therein.

18 Claims, 30 Drawing Sheets

ELECTRONIC DEVICE AND METHOD OF MANUFACTURING THE SAME

CROSS-REFERENCE TO RELATED APPLICATION

The present application claims priority from Japanese Patent Application. No. 2018-109583 filed on Jun. 7, 2018, the content of which is hereby incorporated by reference into this application.

TECHNICAL FIELD OF THE INVENTION

The present invention relates to an electronic device and a technique of manufacturing the same. For example, the present invention relates to a technique effectively applied to an electronic device including a semiconductor laser and a technique of manufacturing the same.

BACKGROUND OF THE INVENTION

Japanese Patent Application Laid-Open Publication. No. 2004-214651 (Patent Document 1) describes a technique of arranging a resistor made of a chip component inside an optical module.

SUMMARY OF THE INVENTION

For example, in a transmission small optical device (TOSA: Transmitter Optical Sub Assembly) used for an optical transceiver, in accordance with increase in the Nyquist frequency of a signal, deterioration of a signal quality due to multiple reflection caused by mismatching between a characteristic impedance of a semiconductor laser and a characteristic impedance a transmission line appears. Therefore, for a purpose of improvement of the signal quality, it is desirable to match the characteristic impedance of the semiconductor laser and the characteristic impedance of the transmission line.

Other objects and novel characteristics will be apparent from the description of the present specification and the accompanying drawings.

An electronic device according to an embodiment includes a semiconductor device electrically connected to a transmission line. In this semiconductor device, a resistor is arranged between a wiring electrically connected to the transmission line and a semiconductor chip having a semiconductor laser formed therein.

According to an embodiment, a performance of an electronic device can be improved.

BRIEF DESCRIPTIONS OF THE DRAWINGS

Figure 18:
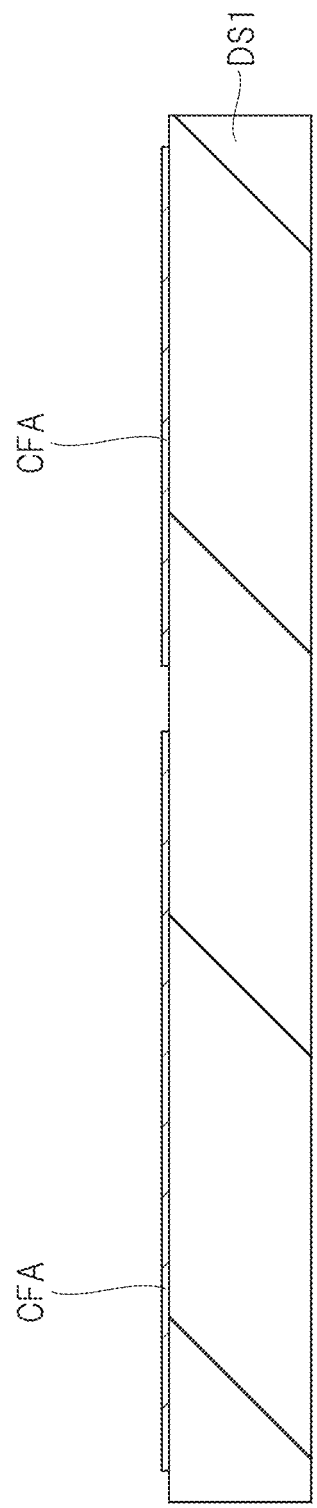
FIG. 18 is a cross-sectional view for explaining the step of forming the thin film resistor, continued from FIG. 17.
Figure 19:
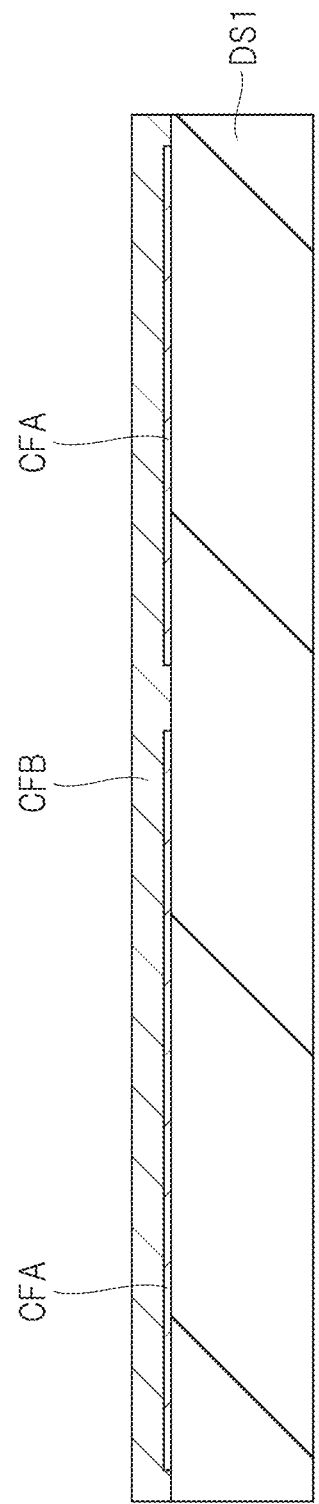
Figure 20:
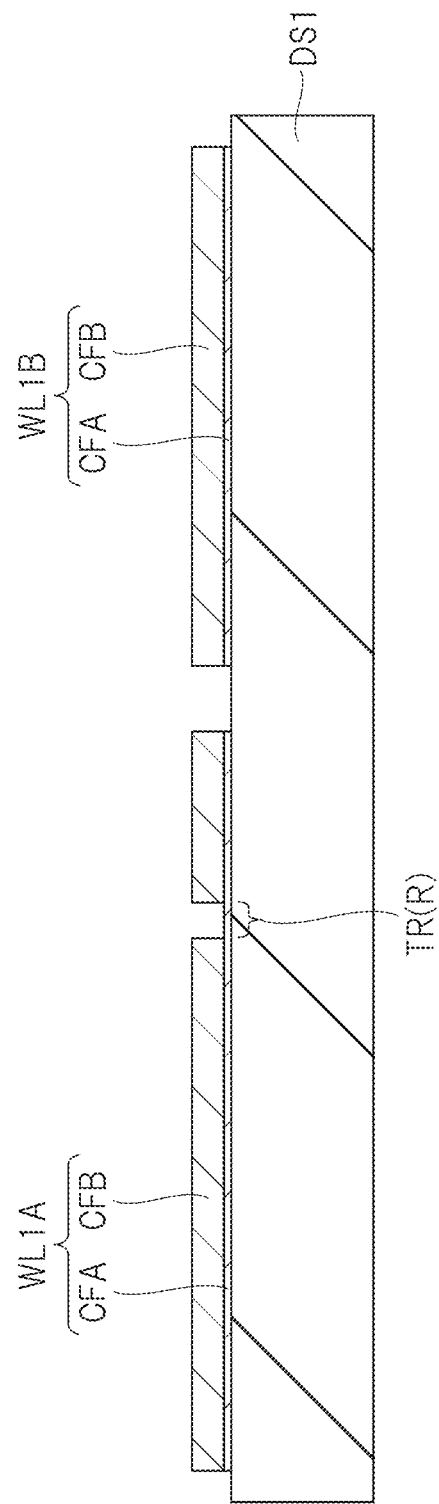
Figure 21:
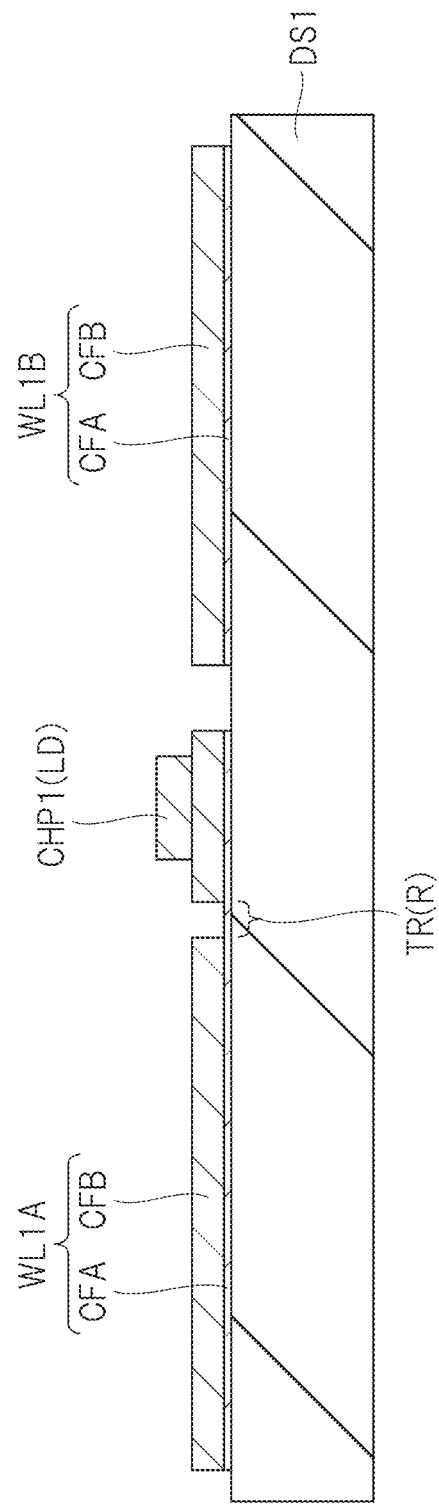
Figure 22:
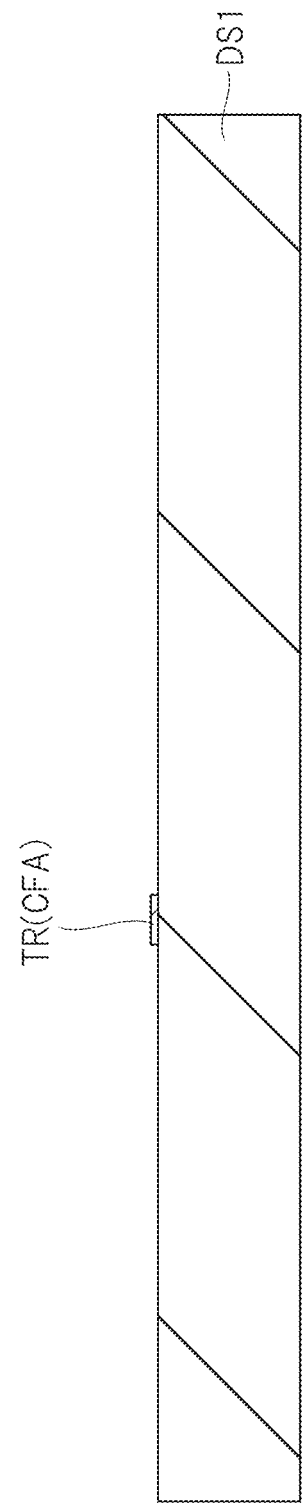
Figure 23:
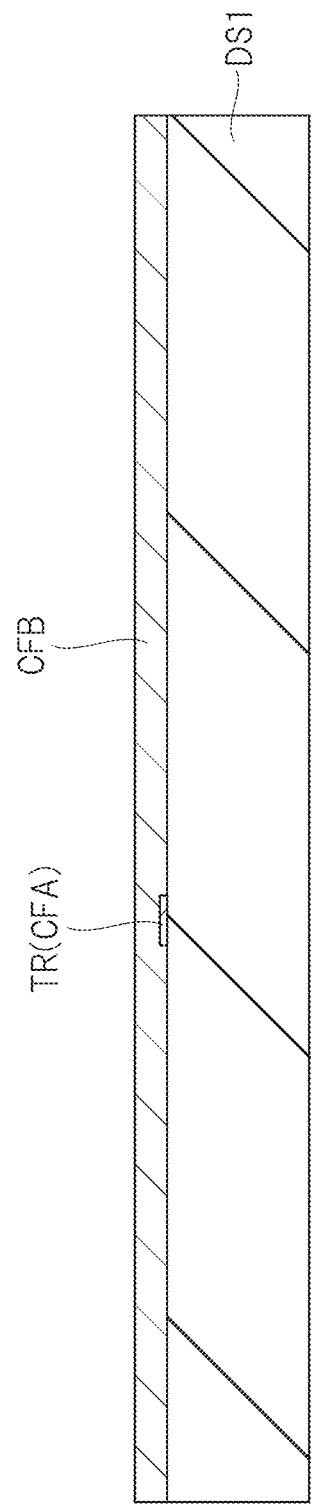
Figure 24:
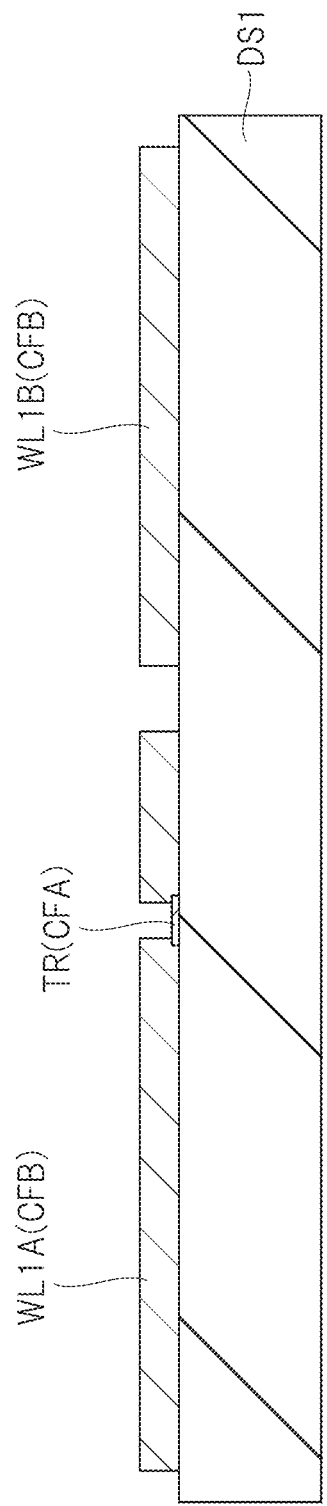
Figure 25:
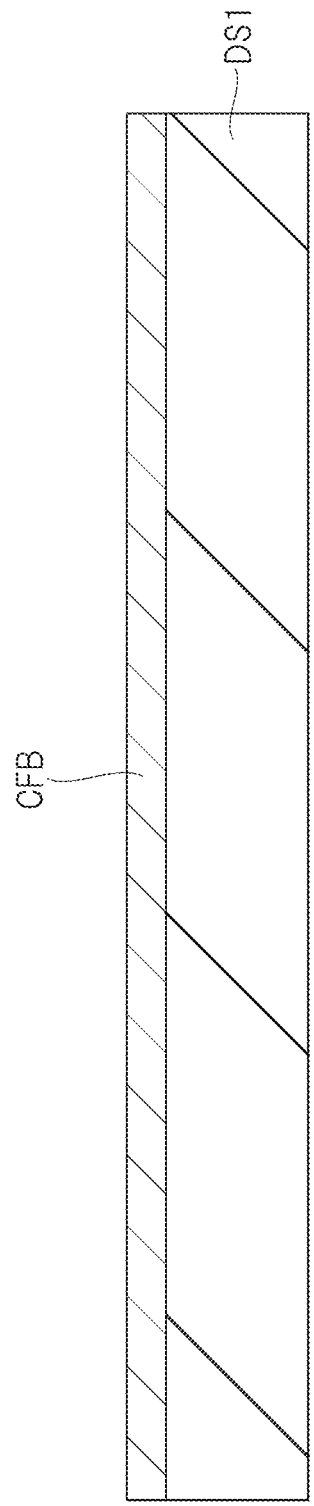
Figure 26:
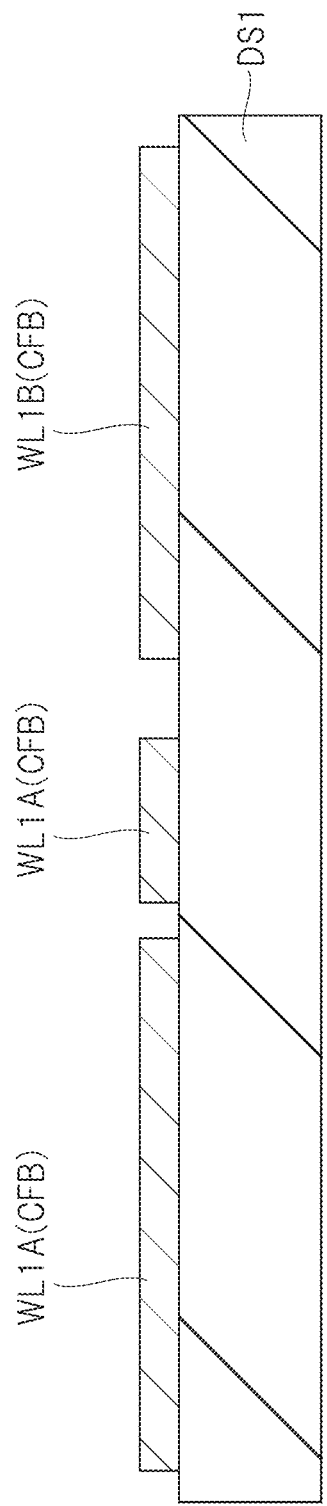
Figure 27:
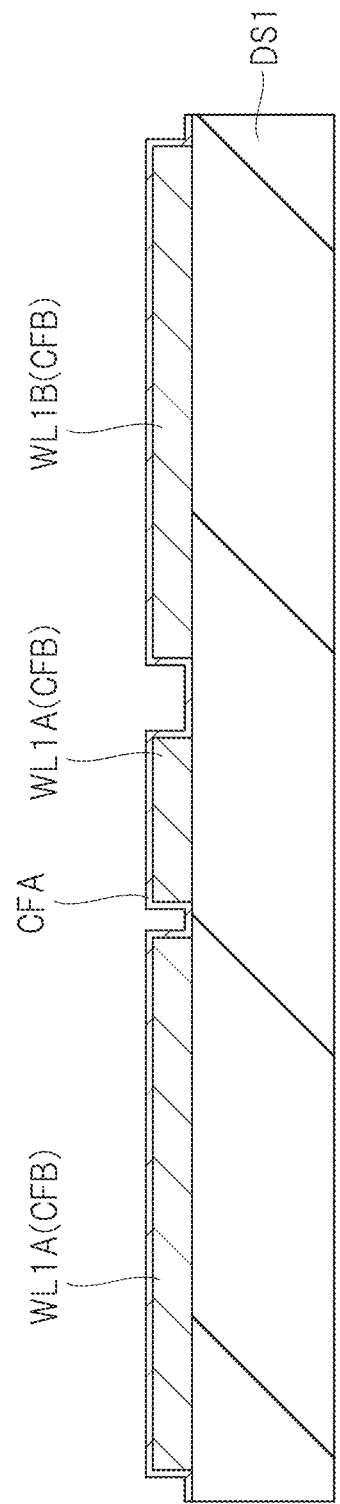
Figure 28:
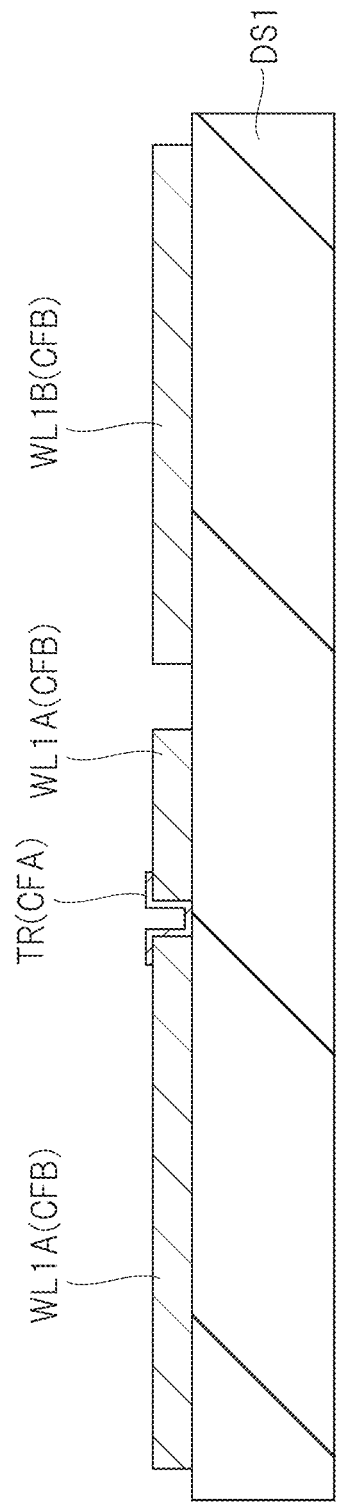
Figure 29:
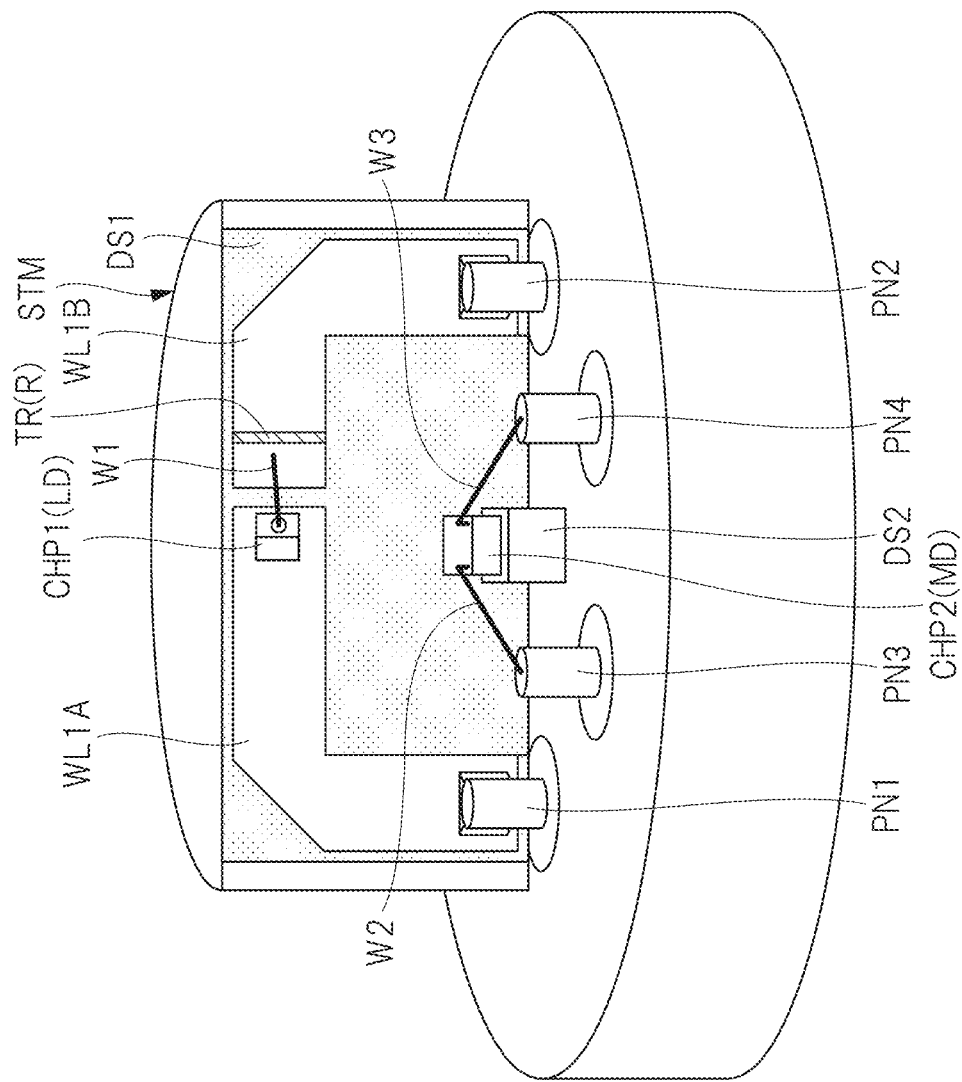
Figure 30:
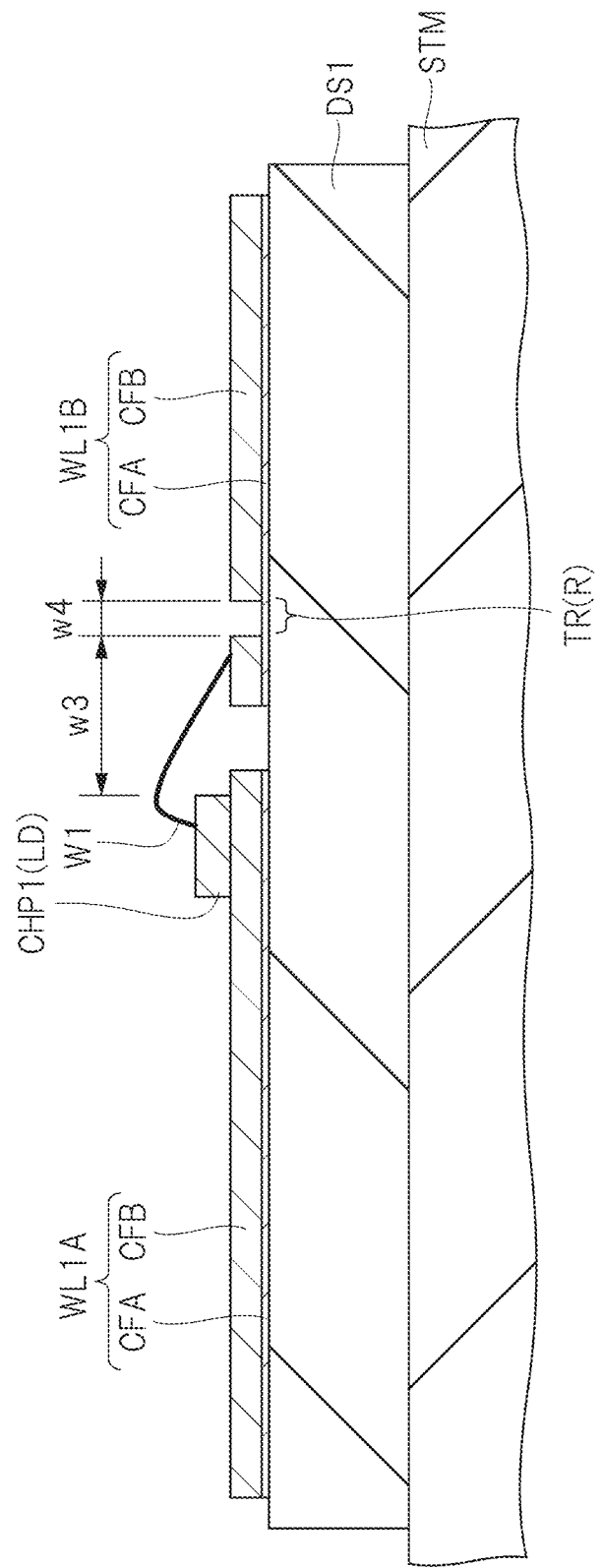

FIG. 19 s a cross-sectional view for explaining the step of forming the thin film resistor, continued from FIG. 18;

FIG. 20 is a cross-sectional view for explaining the step of forming the thin film resistor, continued from FIG. 19;

FIG. 21 is a cross-sectional view for explaining the step of forming the thin film resistor, continued from FIG. 20;

FIG. 22 is a cross-sectional view for explaining a step of forming a thin film resistor in a first modification example;

FIG. 23 is a cross-sectional view for explaining the step of forming the thin film resistor, continued from FIG. 22;

FIG. 24 is a cross-sectional view for explaining the step of forming the thin film resistor, continued from FIG. 23;

FIG. 25 is a cross-sectional view for explaining a step of forming a thin film resistor in a second modification example;

FIG. 26 is a cross-sectional view for explaining the step of forming the thin film resistor, continued from FIG. 25;

FIG. 27 is a cross-sectional view for explaining the step of forming the thin film resistor, continued from FIG. 26;

FIG. 28 is a cross-sectional view for explaining the step of forming the thin film resistor, continued from FIG. 27;

FIG. 29 is a diagram schematically showing a stem in a third modification example; and FIG. 30 is a cross-sectional view schematically showing a specific configuration example of a thin film resistor.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and others), the number of the elements is not limited to a specific number unless otherwise stated or except the case where the number is apparently limited to a specific number principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value and the range described above.

Also, the same components are denoted by the same reference symbols in principle throughout all the drawings for describing the embodiments, and the repetitive description thereof is omitted. Note that hatching is used in some cases even in a plan view so as to make the drawings easy to see.

(First Embodiment)

In the present first embodiment, an electronic device made of an optical transceiver will be described. An optical transceiver is an electronic device having a function of converting an electric signal to an optical signal and transmitting the optical signal and a function of receiving an optical signal and converting the optical signal to an electric signal.

<Study on Improvement>

First, before an optical transceiver in the present, first embodiment is described, a space for improvement existing in a transceiver in a related technique will be described.

Here, the "related technique" described in the present specification is a technique having problems that have been newly found by the inventors, and is not a publicly-known conventional technique. However, this is a technique intentionally described as an assumption technique (non-publicly-known technique) of a new technical concept.

Figure 1:
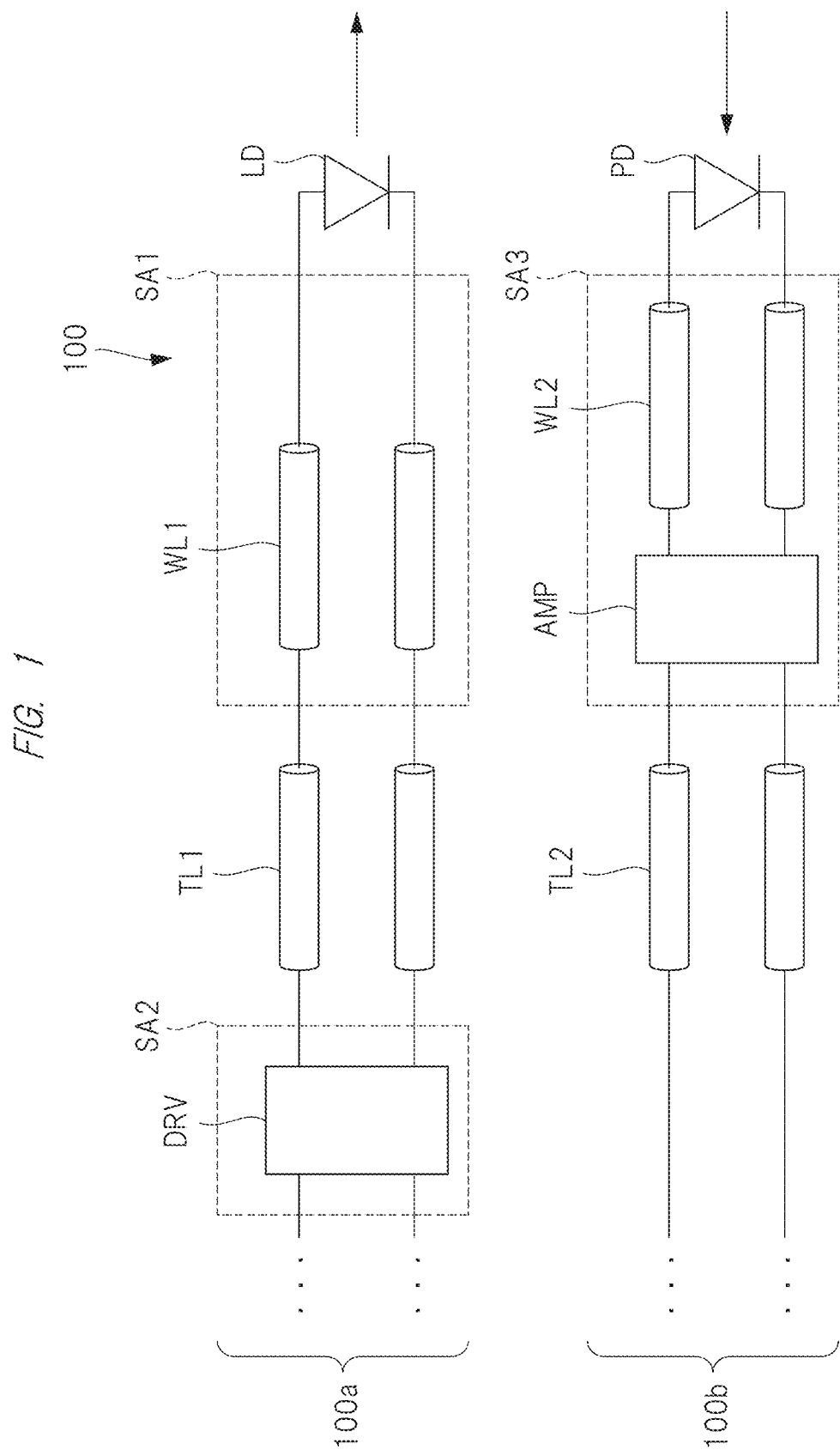
FIG. 1 is a block diagram showing a schematic configuration of an optical transceiver in a related technique.

FIG. 1 is a block diagram showing a schematic configuration of an optical transceiver in the related technique. As shown in FIG. 1, an optical transceiver 100 in the related technique has a transmitter 100a and a receiver 100b.

The transmitter 100a has a wiring WL1, a semiconductor device SA1 including a semiconductor laser LD electrically connected to this wiring WL1, and a semiconductor device SA2 including a driving circuit DRV for driving the semiconductor laser LD. In the transmitter 100a, the semiconductor device SA1 and the semiconductor device SA2 are electrically connected to each other by a transmission line TL1. In this manner, the semiconductor laser LD included in the semiconductor device SA1 is controlled by the driving circuit DRV included in the semiconductor device SA2. That is, the driving circuit DRV is configured to directly modulate the semiconductor laser LD on the basis of the electric signal, so that an optical signal that has been directly modulated on the basis of the electric signal is output from the semiconductor laser LD. In the manner as described above, the transmitter 100a of the optical transceiver 100 is configured.

Next, the receiver 100b has a photodiode PD, a wiring WL2 connected to this photodiode PD, a semiconductor device SA3 including an amplifier AMP electrically connected to the wiring WL2, a transmission line TL2 electrically connected to this semiconductor device SA3, and a signal processing circuit electrically connected to the transmission line TL2 although not shown in FIG. 1. In the receiver 100b configured as described above, when an optical signal is input to the photodiode PD, the optical signal is photoelectrically converted to generate a current signal in the photodiode PD. This current signal is input to the amplifier AMP through the wiring WL2, and is converted into a voltage signal.

For example, in many cases, the current signal (output signal) output from the photodiode PD is weak, and a signal format of this signal is not suitable for being processed in a signal processing circuit (digital circuit). Accordingly, it is necessary to prepare a circuit for amplifying the weak current signal output from the photodiode PD into a signal having a suitable amount for being input to the signal processing circuit. Particularly, although the current signal output from the photodiode PD is an analog signal, the signal processing circuit handles a digital signal. Therefore, it is necessary to prepare an AD converting circuit for converting the analog signal into the digital signal. However, the AD converting circuit for converting the analog signal into the digital signal receives only a voltage signal. From the reason, it is necessary to prepare a transimpedance amplifier for converting the current signal into the voltage signal, and besides, amplifying the signal to a voltage signal having a suitable amount. Therefore, the amplifier AMP included in the semiconductor device SA3 is configured of, for example, a transimpedance amplifier that is an analog circuit functioning as both the converting circuit and the amplifying circuit.

Here, the photodiode PD and the amplifier AMP are embedded in the semiconductor device SA3 in the receiver 100b, and a reason for the embedding will be described. The photodiode PD is configured of, for example, a p/n junction diode. And, in this p/n junction diode, when light enters a depletion layer while a reverse bias voltage is applied to the p/n junction, an electron in a valence band is excited to a conductance band by energy of the light. As a result, while the electron is excited to the conductance band, a hole is generated in the valence band. Then, while the electron excited to the conductance band is accelerated by the reverse bias voltage and is drifted toward a cathode (n-type semiconductor region), the hole generated in the valance band is drifted toward an anode (p-type semiconductor region). As a result, in the photodiode PD, when the light enters, the current flows. That is, in the photodiode PD, the input optical signal is converted into the current signal.

The current signal output from the photodiode PD is input to the amplifier AMP through the wiring WL2. At, this time, when the wiring WL2 is long, a parasitic capacitance of the wiring WL2 is large. When a frequency of the optical signal is high, a frequency of the converted current signal is also high. As a result, an impedance of the wiring WL2 is small for the current signal that is a high-frequency signal, and therefore, a leakage current leaking from the current signal to ground is large. Here, since the current signal output from the photodiode PD is weak, when the leakage current from this weak current signal is large, an S/N ratio (signal/noise ratio) of the current signal is undesirably small. For a purpose of securing the S/N ratio of the current signal output from the photodiode PD, it is necessary to shorten the wiring WL2 as much as possible to reduce the parasitic capacitance of the wiring WL2. Therefore, in the related technique, both the photodiode PD and the amplifier AMP are embedded inside the semiconductor device SA3. Therefore, in the receiver 100b of the optical transceiver 100 in the related technique, the wiring WL2 electrically connecting the photodiode PD and the amplifier AMP can be shortened. As a result, the parasitic capacitance of the wiring WL2 can be reduced. From the above-described reason, in the receiver 100b of the optical transceiver 100, the photodiode PD and the amplifier AMP are embedded inside the semiconductor device SA3.

On the other hand, in the transmitter 100a of the optical transceiver 100, the driving circuit DRV for driving the semiconductor laser LD is not embedded inside the semiconductor device SA1, but is arranged outside the semiconductor device SA1. This is because of the following reason. That is, also in the transmitter 100a of the optical transceiver 100, it is desirable to embed the driving circuit DRV together with the semiconductor laser LD into the semiconductor device SA1 for a purpose of the improvement of the performance. However, the driving circuit DRV for driving the semiconductor laser LD is larger in a size than the amplifier AMP configured of the transimpedance amplifier. From this reason, when the driving circuit DRV is arranged inside the semiconductor device SA1, the size of the semiconductor device SA1 undesirably becomes large, and it is difficult to downsize the semiconductor device SA1 configuring the transmitter 100a. That is, various types of devisal are necessary to achieve a configuration in which the driving circuit DRV is arranged inside the semiconductor device SA1 while the semiconductor device SA1 is downsized. Therefore, in consideration of manufacturing easiness, the configuration in which the driving circuit DRV is arranged outside the semiconductor device SA1 having the semiconductor laser LD embedded therein is currently reasonable. From such a reason, for the transmitter 100a of the optical transceiver 100 in the related technique, the configuration as shown in FIG. 1 in which the driving circuit DRV is arranged in the semiconductor device SA2 that is different from the semiconductor device SA1 having the semiconductor laser LD embedded therein is adopted.

However, in the transmitter 100a of the optical transceiver 100, when the driving circuit DRV for driving the semiconductor laser LD is embedded in the semiconductor device SA2 that is different from the semiconductor device SA1 having the semiconductor laser LD embedded therein, it is necessary to connect the semiconductor device SA1 and the semiconductor device SA2 through the transmission line TL1 in order to electrically connect the semiconductor laser LD and the driving circuit DRV. According to the studies made by the present inventors, it has been found out that a space for improvement appears when the semiconductor device SA1 having the semiconductor laser LD embedded therein and the semiconductor device SA2 having the driving circuit DRV embedded therein are connected to each other by the transmission line TL1. The space for improvement having appeared in the related technique will be described below.

Figure 2:
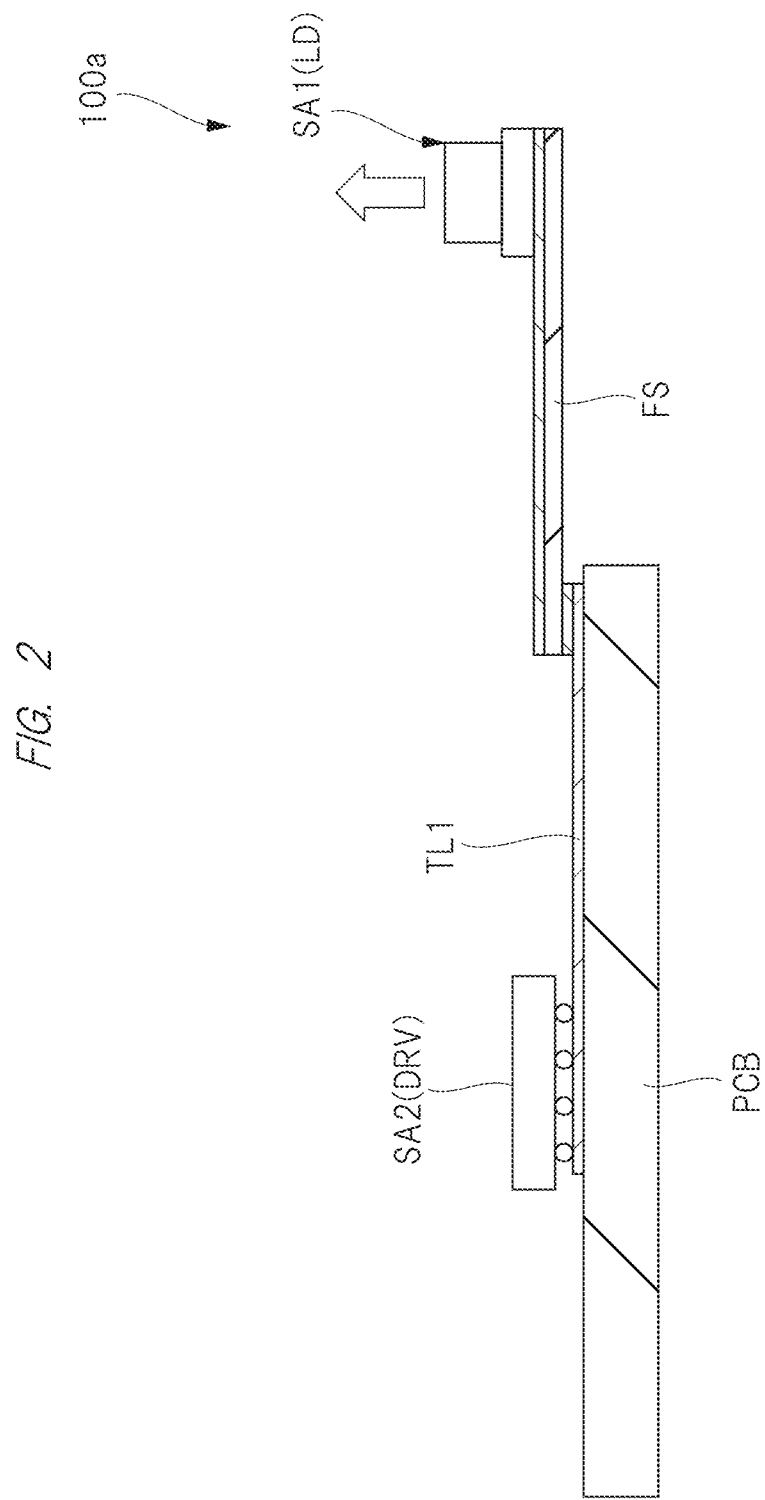
FIG. 2 is a diagram showing a schematic mounting configuration of a transmitter of an optical transceiver.

FIG. 2 is a diagram showing a schematic mounting configuration of the transmitter 100a of the optical transceiver 100. As shown in FIG. 2, the transmitter 100a has a mounting substrate PCB having the transmission line TL1 formed therein, and the semiconductor device SA2 having the driving circuit DRV embedded therein is mounted on this mounting substrate PCB. At this time, as shown in FIG. 2, the semiconductor device SA2 having the driving circuit DRV embedded therein is electrically connected to the transmission line TL1 formed in the mounting substrate PCB. Further, the transmission line TL1 formed in the mounting substrate PCB is electrically connected to the flexible substrate FS having the semiconductor device SA1 including the semiconductor laser LD embedded thereon. As a result, the semiconductor device SA1 having the semiconductor laser LD embedded therein and the semiconductor device SA2 having the driving circuit DRV embedded therein are electrically connected to each other through the transmission line TL1.

Figure 3:
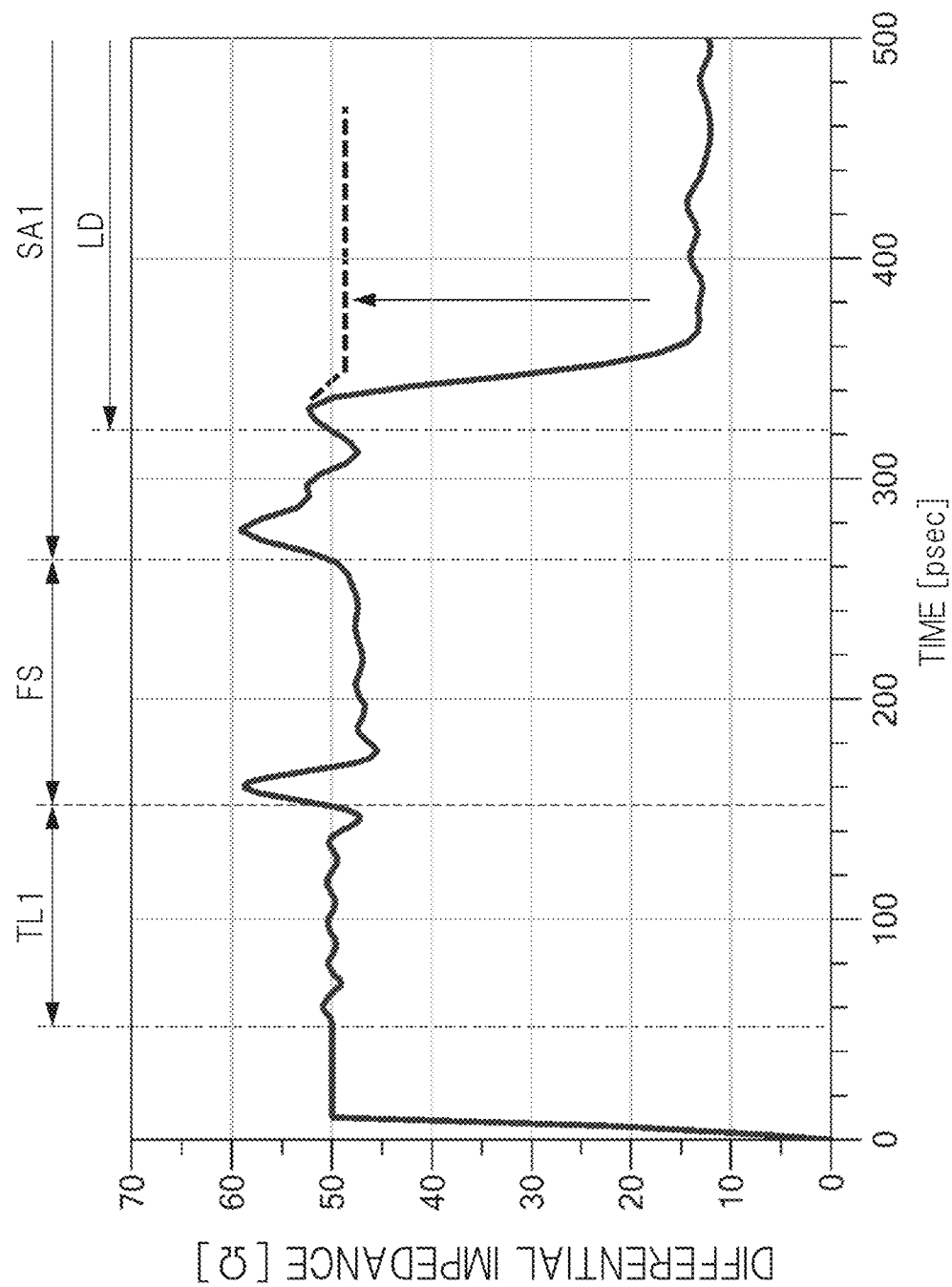
FIG. 3 is a diagram showing a differential impedance between a semiconductor device including a semiconductor laser and a transmission line.

Here, when the semiconductor device SA1 having the semiconductor laser LD embedded therein and the semiconductor device SA2 having the driving circuit DRV embedded therein are connected to each other through the transmission line TL1, it is important to match the impedances between the transmission line TL1 and the semiconductor device SA1 for the purpose of keeping the signal quality (signal waveform). Specifically, FIG. 3 is a diagram showing a differential impedance between the semiconductor device SA1 including the semiconductor laser LD and the transmission line TL1. In FIG. 3, a differential impedance of the transmission line TL1 and a differential impedance of the flexible substrate FS match each other at nearly 50Ω. On the other hand, a differential impedance of the semiconductor laser LD included in the semiconductor device SA1 is about 15Ω, and it has been found out that significant mismatching in the different al impedance is caused between the transmission line TL1 and the semiconductor laser LD. In this case, by the mismatching between the differential impedance of the transmission line TL1 and the differential impedance of the semiconductor laser LD, a part of the current signal flowing through the transmission line TL1 is reflected before inputting to the semiconductor laser LD. This result causes reduction of the quality of the electric signal (deterioration of the waveform of the electric signal) due to the mismatching between the differential impedance of the transmission line TL1 and the differential impedance of the semiconductor laser LD. That is, when the semiconductor device SA1 having the semiconductor laser LD embedded therein and the semiconductor device SA2 having the driving circuit DRV embedded therein are connected to each other through the transmission line TL1, the performance of the optical transceiver 100 is reduced due to the mismatching between the differential impedance of the transmission line TL1 and the differential impedance of the semiconductor laser LD.

The above-described mismatching between the differential impedance of the transmission line TL1 and the differential impedance of the semiconductor laser LD is mainly caused by the much smaller differential impedance of the semiconductor laser LD than the differential impedance of the transmission line TL1.

A reason why the differential impedance of the semiconductor laser LD is much smaller than the differential impedance of the transmission line TL1 will be described below.

First, the semiconductor laser LD is directly modulated by the control of the driving circuit DRV. At this time, the higher the frequency of the electric signal is, the higher a frequency of the direct modulation is. In order to suitably achieve the direction modulation of the semiconductor laser LD even if the frequency of the electric signal is high, it is necessary to improve a response speed of the semiconductor laser LD. In order to improve the response speed of the semiconductor laser LD, it is necessary to make a time constant ($\tau$=RC) of the semiconductor laser LD small. Regarding this, when "R" (resistance value) is made small in order to achieve the small time constant ($\tau$=RC), the differential impedance of the semiconductor laser LD is small. Meanwhile, even when "C" (parasitic capacitance) is made small in order to achieve the small time constant ($\tau$=RC), if the frequency (f) of the direction modulation of the semiconductor laser LD is made high so as to also handle a higher frequency signal, the differential impedance ($1/\omega C$) of the semiconductor laser LD becomes small. In the semiconductor laser LD performing the direct modulation as described above, the differential impedance tends to be small. As a result, the semiconductor laser LD performing the direct modulation is much smaller in the differential impedance than the transmission line TL1. That is, in order to achieve such direct modulation of the semiconductor laser LD as handling the high frequency signal, it is necessary to make the differential impedance of the semiconductor laser LD small, and therefore, the mismatching between the differential impedance of the transmission line TL1 and the differential impedance of the semiconductor laser LD is caused.

Regarding this, not the adoption of the direct modulation method to the semiconductor laser LD but adoption of an indirect modulation method that separately arranges a modulator thereto is considered. This it because, since it is not necessary to directly modulate the light emitted from the semiconductor laser LD, it is not necessary to make the impedance small in order to improve the response speed of the semiconductor laser LD. That is, in the case of the adoption of the indirect modulation method to the semiconductor laser LD, the differential impedance of the semiconductor laser LD can be matched with the differential impedance of the transmission line TL1. Therefore, even if the transmission line TL1 is used, the mismatching in the differential impedance can be suppressed.

However, the indirect modulation method has a higher manufacturing cost than that of the direct modulation method. Therefore, in the optical transceiver 100, the direct modulation method is adopted. However, when the indirect modulation method is adopted as described above, it is necessary to make the differential impedance of the semiconductor laser LD small in order to improve the response speed, and, as a result, the mismatching between the differential impedance of the transmission line TL1 and the differential impedance of the semiconductor laser LD appears as the space for the improvement.

Here, for example, if the driving circuit DRV that drives the semiconductor laser LD and the semiconductor laser LD can be embedded into one semiconductor device SA1, the transmission line TL1 is unnecessary, and besides, the deterioration of the waveform input to the semiconductor laser LD can be suppressed when, for example, an equalizer is added to the driving circuit DRV so as to adjust the waveform of the electric signal input to the semiconductor laser LD. However, in order to embed the driving circuit DRV into the semiconductor device SA1 as described above, various types of devisal are necessary, and the embedding faces a big hurdle for the achievement. From this reason, in consideration of the manufacturing easiness, the adoption of the configuration in which the driving circuit DRV is arranged outside the semiconductor device SA1 having the semiconductor laser LD embedded therein is reasonable.

In the above description, the mismatching in the impedance between the transmission line TL1 and the semiconductor laser LD appears as the space for the improvement particularly because (1) the semiconductor laser LD and the driving circuit DRV are connected to each other through the transmission line TL1 by the arrangement of the driving circuit DRV outside the semiconductor device SA1 having the semiconductor laser LD embedded therein and (2) the semiconductor laser LD is directly modulated by the driving circuit DRV.

Accordingly, in the present first embodiment, the above-described space for the improvement has been developed. A technical concept in the present embodiment with this development will be described below.

<Configuration of Electronic Device (Optical Transceiver) in First Embodiment>

Figure 4:
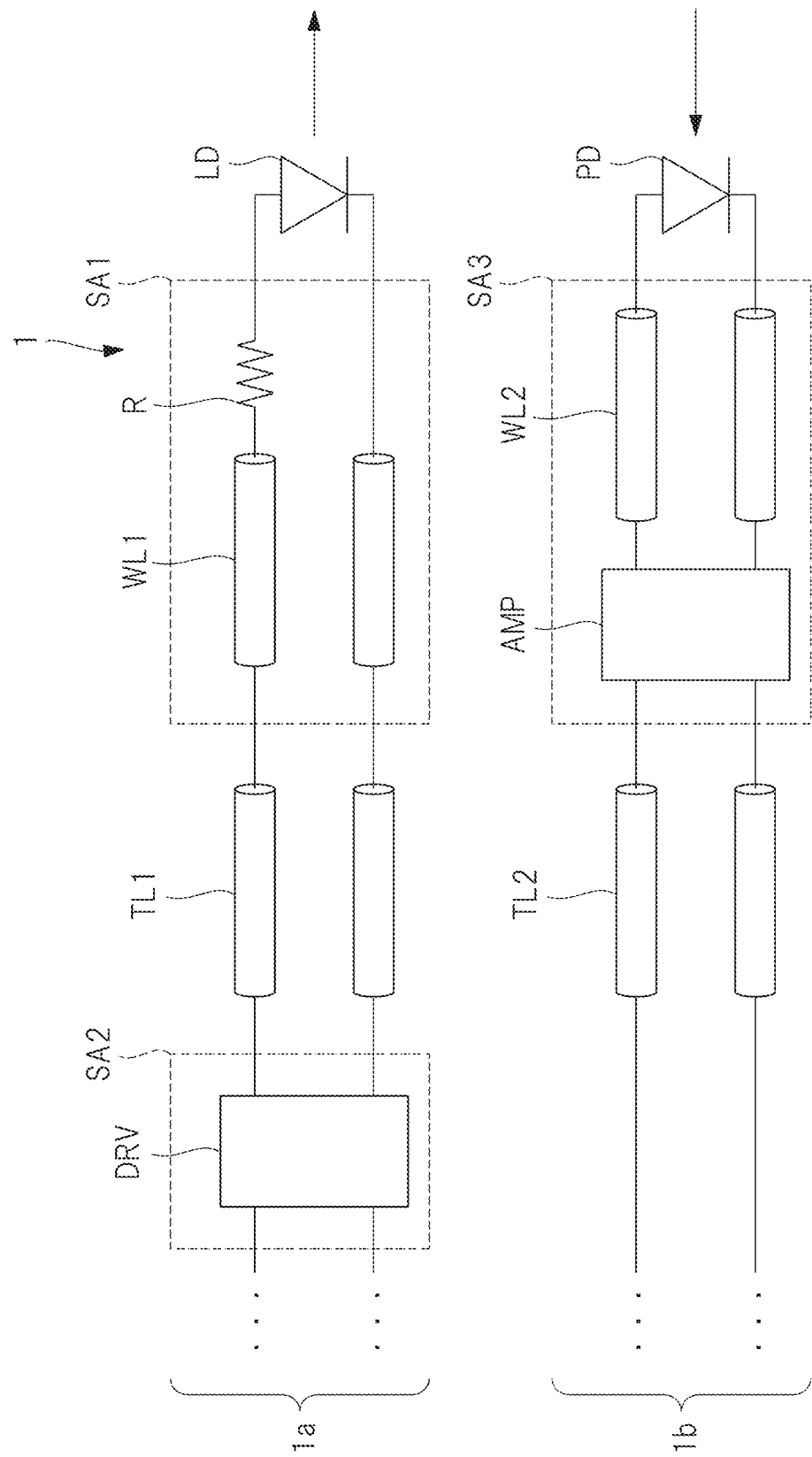
FIG. 4 is a block diagram showing a configuration of an optical transceiver in a first embodiment.

FIG. 4 is a block diagram showing a schematic configuration of the optical transceiver in the present first embodiment. As shown in FIG. 4, the optical transceiver 1 in the present first embodiment has a transmitter 1*a* and a receiver 1*b*.

The transmitter 1*a* has : the wiring WL1; the resistor R that is electrically connected to this wiring WL1; the semiconductor device SA1 including the semiconductor laser LD electrically connected to the resistor R; and the semiconductor device SA2 including the driving circuit DRV for driving the semiconductor laser LD. Specifically, the semiconductor laser LD is formed in a semiconductor chip (second semiconductor chip), and the wiring WL1, the resistor R and the semiconductor chip having the semiconductor laser LD formed therein are embedded in the semiconductor device SA1. On the other hand, the driving circuit DRV is formed in a semiconductor chip (first semiconductor chip), and the semiconductor chip having the driving circuit DRV formed therein is embedded in the semiconductor device SA2. In the transmitter 1*a* of the optical transceiver 1, the semiconductor device SA1 and the semiconductor device SA2 are electrically connected to each other through the transmission line TL1. In this manner, the semiconductor laser LD formed in the semiconductor chip included in the semiconductor device SA1 is controlled by the driving circuit DRV formed in semiconductor chip included in the semiconductor device SA2. That is, the driving circuit DRV is configured to directly modulate the semiconductor laser LD on the basis of the electric signal, so that an optical signal that is directly modulated on the basis of the electric signal is output from the semiconductor laser LD.

As seen from the above description, the optical transceiver (electronic device) 1 in the present first embodiment has: the first semiconductor chip having the driving circuit DRV for driving the semiconductor laser LD formed therein; the transmission line TL1 electrically connected to the first semiconductor chip; and the semiconductor device SA1 electrically connected to the transmission line TL1. Here, the semiconductor device SA1 has: the wiring WL1 electrically connected to the transmission line TL1; the resistor R connected to the wiring WL1; and the second semiconductor chip having the semiconductor laser LD electrically connected to the resistor R formed therein. In this manner, the transmitter 1*a* of the optical transceiver 1 in the present first embodiment is configured.

Next, the receiver 1b of the optical transceiver 1 has: the photodiode PD; a semiconductor device SA3 including the wiring WL2 connected to this photodiode PD and the amplifier AMP electrically connected to the wiring WL2; the transmission line TL2 electrically connected to this semiconductor device SA3; and a signal processing circuit electrically connected to the transmission line TL2 although not shown in FIG. 4. In the receiver 1b configured as described above, when the optical signal is input to the photodiode PD, the optical signal is photoelectrically converted to generate the current signal in the photodiode PD. This current signal is input to the amplifier AMP, and is converted into a voltage signal. In this manner, the receiver 1b of the optical transceiver 1 in the first embodiment is configured.

<Feature in First Embodiment>

Subsequently, a feature in the present first embodiment will be described. As the feature in the present first embodiment, for example, the resistor R electrically connected to the semiconductor laser LD is arranged inside the semiconductor device SA1 configuring a part of the transmitter 1a of the optical transceiver 1 as shown in FIG. 4. Because of this feature, according to the present first embodiment, the mismatching between the differential impedance of the transmission line TL1 and the differential impedance of the semiconductor laser LD can be suppressed by the existence of the resistor R. For example, when the resistor R does not exist inside the semiconductor device SA1, the differential impedance (about 50Ω) of the transmission line TL1 and the differential impedance (about 15Ω) of the semiconductor laser LD are significantly different from each other as shown in FIG. 3, and therefore, the mismatching in the differential impedance between the transmission line TL1 and the semiconductor laser LD is caused. Regarding this, for example, when the resistor R (about 35Ω) electrically connected to the semiconductor laser LD is arranged inside the semiconductor device SA1, the mismatching in the impedance between the transmission line TL1 and the semiconductor laser LD is canceled. As a result, when the semiconductor laser LD is directly modulated by the driving circuit DRV arranged outside the semiconductor device SA1 through the transmission line TL1, the mismatching in the impedance between the transmission line TL1 and the semiconductor laser LD can be canceled even if the differential impedance of the semiconductor laser LD is made small in order to improve the response speed of the semiconductor laser LD (in order to make the RC time constant small). That is, according to the feature in the present embodiment, both the improvement of the response speed of the semiconductor laser LD by the small differential impedance of the semiconductor laser LD and the impedance matching between the transmission line TL1 and the semiconductor laser LD can be achieved. In the manner, according to the feature in the present embodiment, the performance of the optical transceiver 1 that is the electronic device can be improved. For example, according to the optical transceiver 1 in the present first embodiment, a high-frequency signal having a Nyquist frequency that is larger than 10 GHz can be also handled.

Here, the Nyquist frequency means a frequency that is equivalent to ½ times a sampling frequency obtained when a certain signal is sampled. A signal having a higher frequency than this Nyquist frequency cannot be correctly detected. That is, in order to correctly detect a signal having a frequency to be detected, a sampling interval (sampling frequency) that is twice the frequency is necessary. For example, when the sampling interval (sampling frequency) is 20 Hz, the Nyquist frequency is 10 Hz.

Particularly, in order to handle a high-frequency signal having a much higher frequency, it is desirable to, for example, shorten a distance between the semiconductor laser LD and the resistor R in FIG. 4. This is because, when the high-frequency signal having the much higher frequency is handled, if a length of the wiring between the semiconductor laser LD and the resistor R (terminating resistor) is not sufficiently shorter than a wave length of the high-frequency signal (electromagnetic wave), the wiring between the semiconductor laser LD and the resistor R has to be also regarded as a transmission line. That is, this is because, if the length of the wiring between the semiconductor laser LD and the resistor R (terminating resistor) is not sufficiently shorter than the wave length of the high-frequency signal (electromagnetic wave), multiple reflection undesirably occurs in this wiring, which results weakening the effect of the resistor R functioning as the terminating resistor. Therefore, for example, when an effective wavelength of the high-frequency signal calculated from the Nyquist frequency of the high-frequency signal is assumed to be "$\lambda e$", it is desirable to arrange a near-end portion of the resistor R (end portion thereof facing the semiconductor laser) in a distance that is equal to or smaller than "$\lambda e/8$" (larger than 0) from an end portion of the semiconductor laser LD.

While the semiconductor laser LD and the resistor R are embedded inside the semiconductor device SA1, the driving circuit DRV is embedded inside the semiconductor device SA2 arranged outside the semiconductor device SA1. From, the reason, a distance between the driving circuit DRV and the semiconductor laser LD is obviously larger than a distance between the semiconductor laser LD and the resistor R. Therefore, a distance between the semiconductor chip (second semiconductor chip) having the driving circuit DRV formed therein and the semiconductor chip (first semiconductor chip) having the semiconductor laser LD formed therein is larger than "$\lambda e/8$".

Further, it is desirable to shorten a length of the resistor R. This is because a large length of the resistor R causes influences of a parasitic inductance and a parasitic capacitance, and therefore, when the high-frequency signal having the much higher frequency is handled, it is difficult to adjust the impedance of the resistor R to a desirable value so that the differential impedance of the transmission line TL1 and the differential impedance of the semiconductor laser LD match each other. For example, when the effective wavelength of the high-frequency signal calculated from the Nyquist frequency of the high-frequency signal is assumed to be "$\lambda e$", the length of the resistor R is desirably equal to or smaller than "$\lambda e/16$".

For the purpose of the impedance matching, it is desirable to adjust the impedance value of the resistor R so as to match a difference between the differential impedance of the transmission line TL1 and the differential impedance of the semiconductor laser LD (so as to cause "a reflection coefficient $\Gamma=0$"). However, when the resistor R is arranged, power consumption is increased by Joule heat in the resistor R. Thus, for the purpose of the suppression of the increase of the power consumption in the optical transceiver 1 together with the suppression of the deterioration of the waveform of the high-frequency signal for achieving the impedance matching, it is desirable to adjust the impedance value of the resistor R so as to cause "the reflection coefficient $\Gamma=0.25$ or smaller".

(Second Embodiment)

In the present second embodiment, an example in which the resistor R in the first embodiment is configured of a chip resistor (chip component) will be described.

<Configuration of Semiconductor Device>

Figure 5:
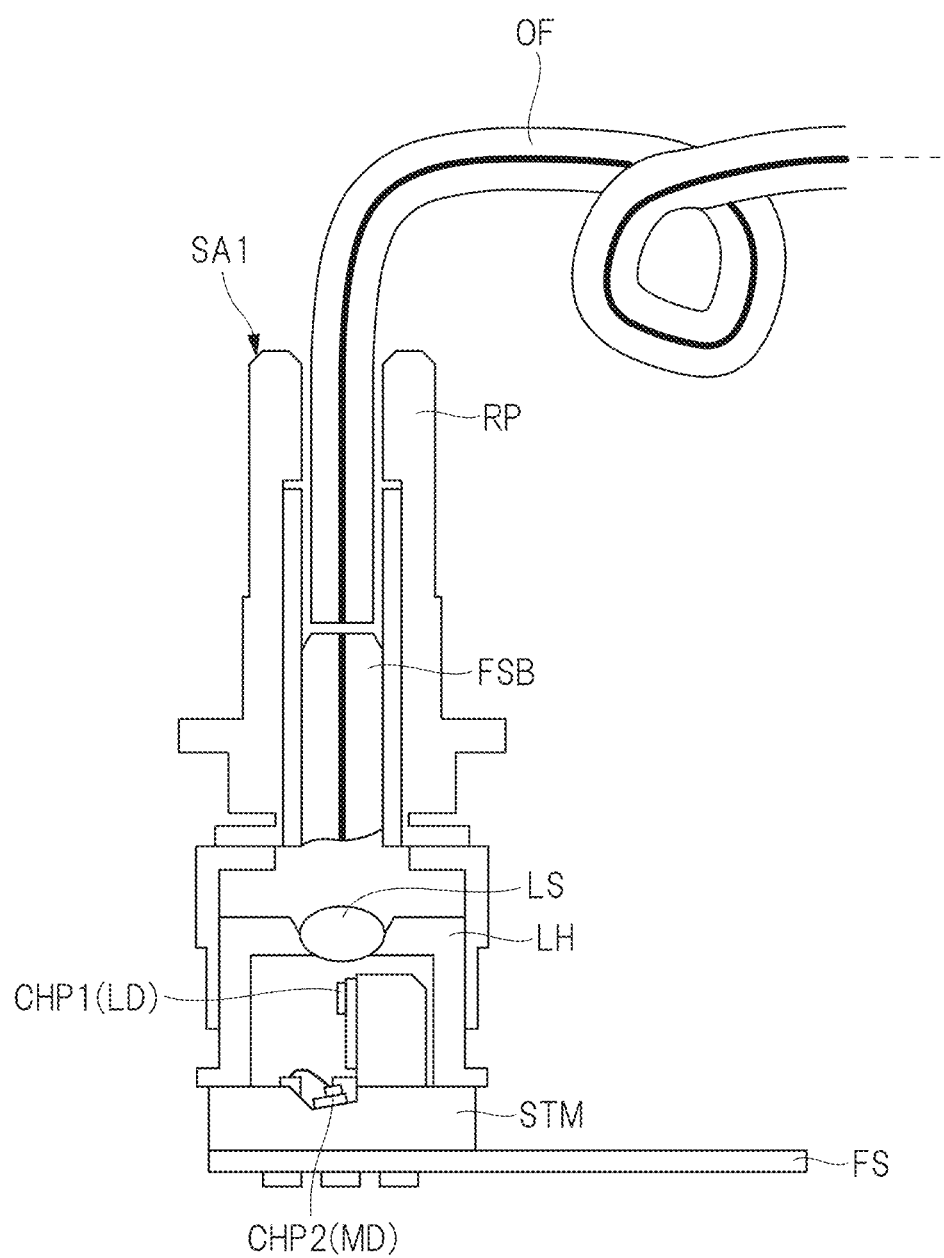
FIG. 5 is a diagram showing an outline configuration of a semiconductor device that is a transmission small optical device.

FIG. 5 is a diagram showing an outline configuration of the semiconductor device SA1 that is the transmission small optical device (TOSA). As shown in FIG. 5, the semiconductor device SA1 is configured of: a stem STM on which the semiconductor chip CHP1 having the semiconductor laser LD formed therein and the semiconductor chip CHP2 having the monitor photodiode MD formed therein are mounted; a flexible substrate FS connected to this stem STM; and a receptacle RP in which a lens folder LH having a lens LS arranged therein and a fiber stub FSB are embedded. The semiconductor device SA1 configured as described above is connected to an optical fiber OF and is eventually built in an optical communication system.

Figure 6:
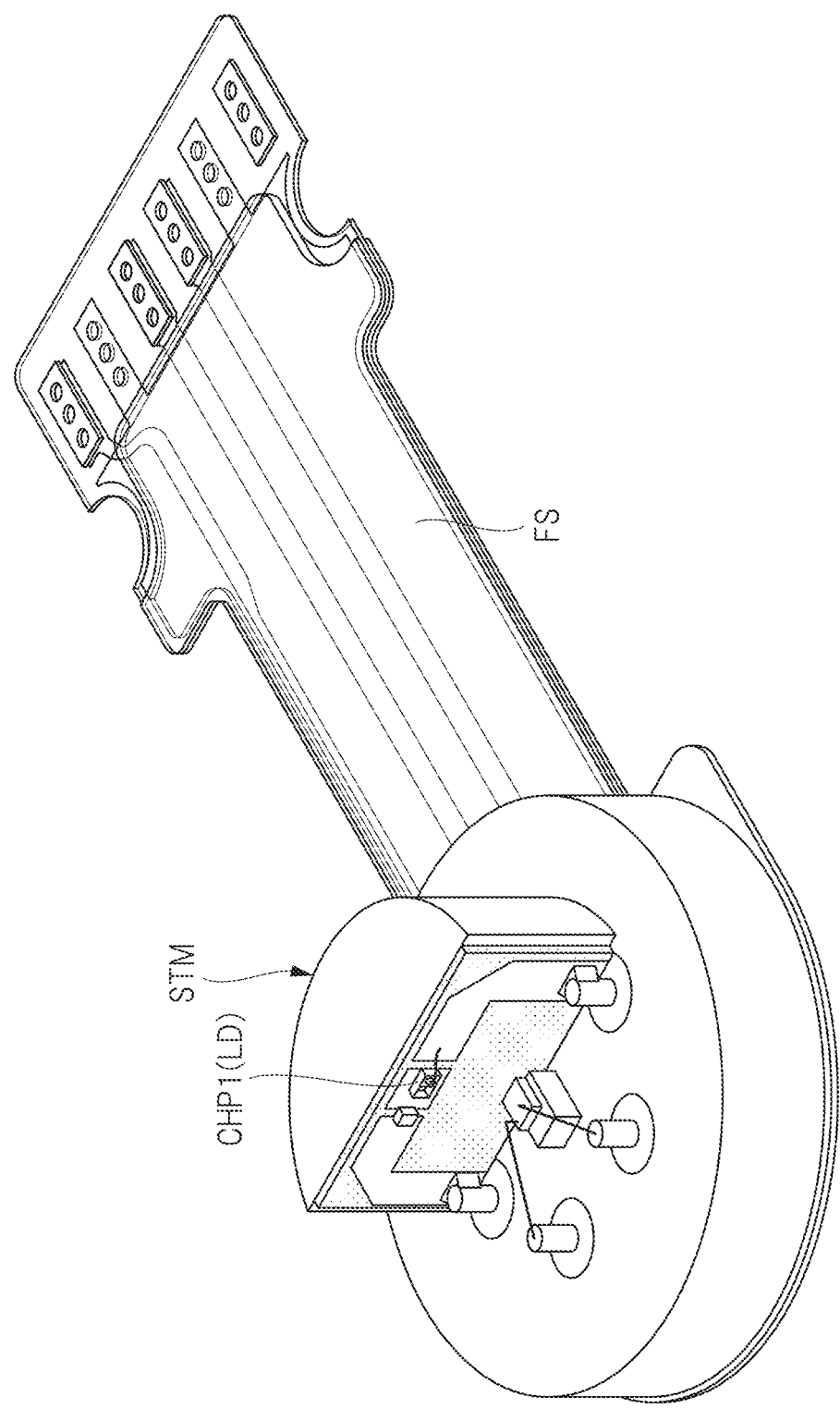
FIG. 6 is a perspective view schematically showing a stem and a flexible substrate configuring a part of the semiconductor device.

FIG. 6 is a perspective view schematically showing the stem STM and the flexible substrate FS configuring a part of the semiconductor device SA1. In FIG. 6, the stem STM and the flexible substrate FS are parts corresponding to a route through which the high-frequency signal (high-speed signal) is transmitted in the semiconductor device SA1. In the stem STM, the semiconductor chip CHP1 having the semiconductor laser LD formed therein is mounted. On the other hand, in the flexible substrate FS, a DC/RF signal line is formed.

Figure 7:
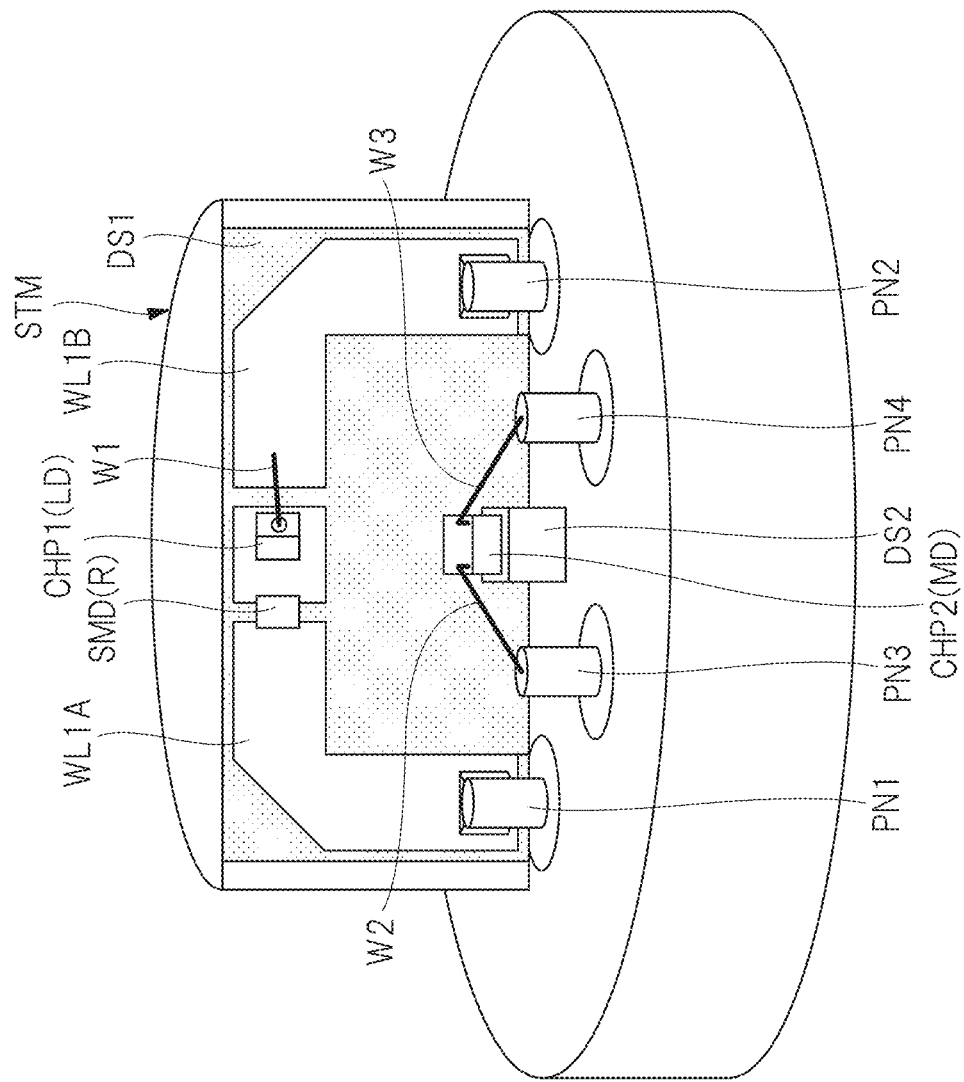
FIG. 7 is a diagram showing a detailed configuration of the stem.

Next, FIG. 7 is a diagram showing a detailed configuration of the stem STM. In the stem STM, for example, a dielectric substrate DS1 made of aluminum nitride (AlN) is arranged. A wiring WL1A and a wiring WL1B are formed on a surface of this dielectric substrate DS1, and the semiconductor chip CHP1 having the semiconductor laser LD formed therein is mounted over an end portion of the wiring WL1A. Over the wiring WL1A, a chip resistor SMD configuring the resistor R is also mounted at a position that is away by a predetermined distance from the semiconductor chip CHP1. Further, the wiring WL1A is connected to a DC/RF signal injection pin PN1. Meanwhile, the wiring WL1B and the semiconductor chip CHP1 are connected to each other through a wire W1, and the wiring WL1B is connected to a DC/RF signal injection pin PN2. As shown in FIG. 7, the stem STM has the semiconductor chip CHP2 having the monitor photodiode MD formed therein for the feedback control of the optical output from the semiconductor laser LD, and the semiconductor chip CHP2 is mounted over a dielectric substrate DS2. As shown in FIG. 7, the semiconductor chip CHP2 having the monitor photodiode MD formed therein is connected to a monitor pin PN3 through a wire W2, and is connected to a monitor pin PN4 through a wire W3.

Each of the dielectric substrate DS1 and the dielectric substrate DS2 is made of, for example, aluminum nitride. Meanwhile, for each of the dielectric substrate DS1 and the dielectric substrate DS2, a material can be selected for a purpose of a function as a heatsink and a purpose of designing in the characteristic impedance. Therefore, for each of the dielectric substrate DS1 and the dielectric substrate DS2, for example, a dielectric material having a heat conductivity of 100 W/(m·k) or higher at a room temperature can be also used. Each of the wiring WL1A and the wiring WL1B can be made of a micro-strip line. For example, each characteristic impedance (single end) of the wiring WL1A and the wiring WL1B is 25Ω, and the characteristic impedance (differential impedance) in the wiring WL1A and the wiring WL1B is 50Ω.

Figure 8:
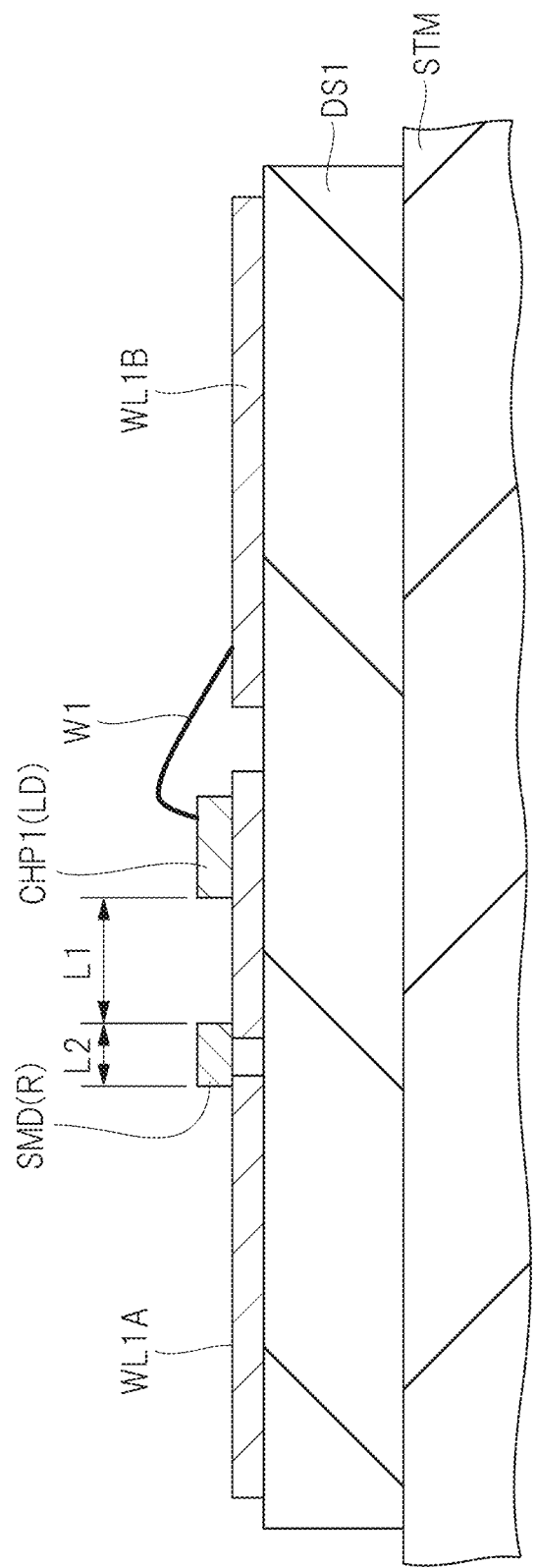
FIG. 8 is a cross-sectional view schematically showing a semiconductor chip and a chip resistor mounted over a dielectric substrate.

Subsequently, FIG. 8 is a cross-sectional view schematically showing the semiconductor chip and the chip resistor mounted over the dielectric substrate. As shown in FIG. 8, over the dielectric substrate DS1 arranged in the stem STM, the wiring WL1A and the wiring WL1B are formed. Over the wiring WL1A, the semiconductor chip CHP1 having the semiconductor laser LD formed therein and the chip resistor SMD functioning as the resistor R are mounted so as to be away from each other. Meanwhile, the wiring WL1B and the semiconductor chip CHP1 are electrically connected to each other through the wiring W1.

Here, a distance between an end portion of the semiconductor chip CHP1 and one end portion of the chip resistor SMD (an end portion thereof facing the semiconductor chip CHP1) is assumed to be "L1". For example, when the effective wavelength of the high-frequency signal calculated from the Nyquist frequency of the high-frequency signal is assumed to be "$\lambda e$", this distance "L1" is desirably equal to or smaller than "$\lambda e/8$". This is because, if a length of the wiring WL1A between the semiconductor laser LD and the chip resistor SMD (terminating resistor) is not sufficiently shorter than the wave length of the high-frequency signal (electromagnetic wave), the multiple reflection undesirably occurs in this wiring WL1A as described in the first embodiment, which results in weakening the effect of the chip resistor SMD functioning as the terminating resistor.

Further, as shown in FIG. 8, when the length of the chip resistor SMD is assumed to be "L2", the length L2 of the chip resistor SMD is desirably equal to or smaller than "$\lambda e/16$". This is because a large length of the chip resistor SMD causes influences of the parasitic inductance and the parasitic capacitance as described in the embodiment, and therefore, when the high-frequency signal having the much higher frequency is handled, it is difficult to adjust the impedance of the chip resistor SMD to a desirable value so that the differential impedance of the transmission line TL1 and the differential impedance of the semiconductor laser LD match each other.

<Method of Mounting Chip Resistor>

Next, a method of mounting the chip resistor SMD over the wiring WL1A formed in the surface of the dielectric substrate DS1 will be described.

Figure 9:
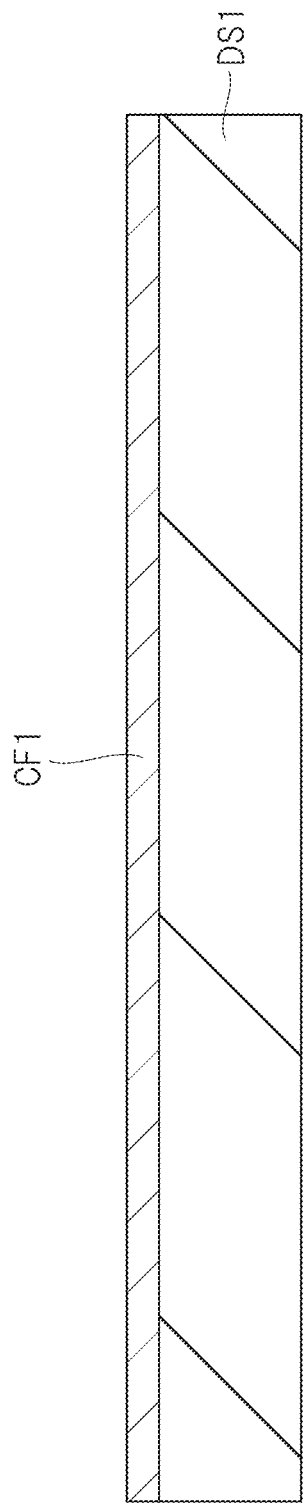
FIG. 9 is a cross-sectional view for explaining a step of mounting the chip resistor in the first embodiment.
Figure 10:
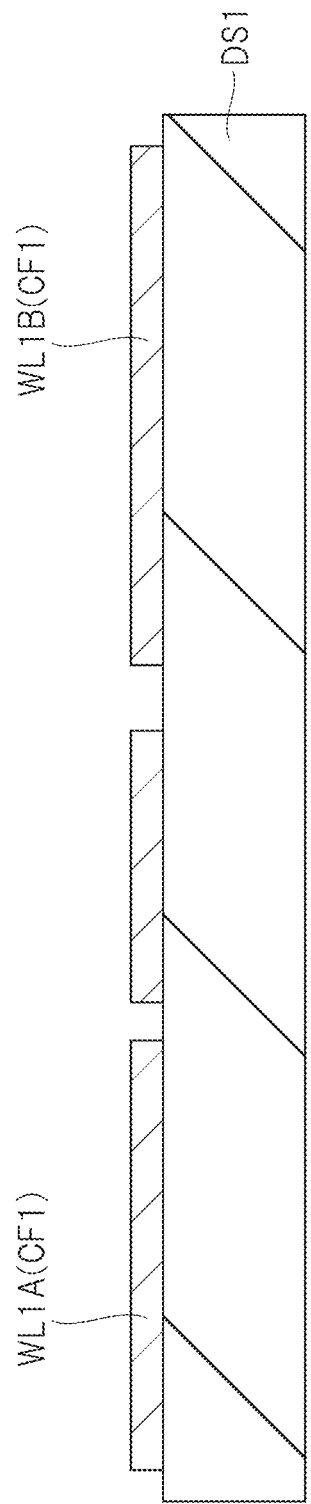
FIG. 10 is a cross-sectional view for explaining the step of mounting the chip resistor, continued from FIG. 9.
Figure 11:
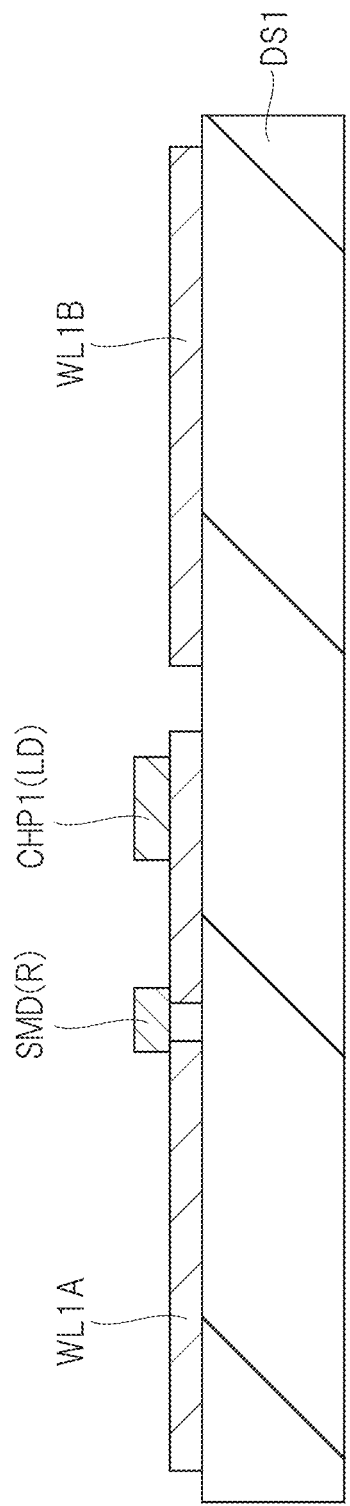
FIG. 11 is a cross-sectional view for explaining the step of mounting the chip resistor, continued from FIG. 10.

First, as shown in FIG. 9, for example, the dielectric substrate DS1 having a conductive film CF1 formed in a surface is prepared. Next, as shown in FIG. 10, the conductive film CF1 is patterned by using a photolithography technique and an etching technique to form the wiring WL1A and the wiring WL1B. Subsequently, as shown in FIG. 11, over the wiring WL1A the semiconductor chip CHP1 having the semiconductor laser LD formed therein is mounted, and the chip resistor SMD is mounted. In the manner as described above, over the wiring WL1A formed on the surface of the dielectric substrate DS1, the semiconductor chip CHP1 having the semiconductor laser LD formed therein and the chip resistor SMD can be mounted.

Here, the chip resistor SMD is mounted over the wiring WL1A through, for example, a bonding material. However, at this time, for example, an optical component including a lens is included in the semiconductor device SA1 including the stem STM as shown in FIG. 5, and therefore, a solder flux that causes characteristic deterioration of such an optical component cannot be used. That is, for a purpose of suppression of the characteristic deterioration of the optical component, a solder material containing the flux cannot be used for the connection between the chip resistor SMD and the wiring WL1A, and therefore, any devisal is necessary to mount the chip resistor SMD over the wiring WL1A.

Regarding this, for example, a pad portion of the chip resistor SMD is plated with gold, and a gold-tin (AuSn) sheet is inserted between the chip resistor SMD and the wiring WL1A and is heated to be melted, so that the chip resistor SMD can be mounted over the wiring WL1A with flux-free. In the manner, the chip resistor SMD used for compensating the characteristic impedance can be mounted over the wiring WL1A while the characteristic deterioration of the optical component is suppressed.

<Effect in Second Embodiment>

In the semiconductor device SA1 in the present second embodiment, for example, as shown in FIG. 7, the chip resistor SMD electrically connected to the semiconductor chip CHP1 having the semiconductor laser LD formed therein is arranged inside the semiconductor device SA1. In the manner, according to the present second embodiment, by the existence of the chip resistor SMD used for the impedance compensation (for the impedance matching) functioning as the terminating resistor, the mismatching between the differential impedance of the transmission line TL1 (see FIG. 4) and the differential impedance of the semiconductor laser LD can be suppressed.

(Third Embodiment)

<Study on Further Improvement>

In the second embodiment, for example, as shown in FIG. 8, the chip resistor SMD is mounted at the position that is away from the semiconductor chip CHP1 over the wiring WL1A, so that the characteristic impedance of the semiconductor laser LD formed in the semiconductor chip CHP1 is compensated.

Here, in FIG. 8, as the Nyquist frequency of the high-frequency signal is larger, the length of the wiring WL1A between the semiconductor chip CHP1 having the semiconductor laser LD formed therein and the chip resistor SMD is more unignorable. That is, if the length of the wiring WL1A between the semiconductor chip CHP1 having the semiconductor laser LD formed therein and the chip resistor SMD (terminating resistor) is not sufficiently shorter than the wave length of the high-frequency signal (electromagnetic wave), the multiple reflection undesirably occurs in this wiring WL1A, which results in weakening the effect of the chip resistor SMD functioning as the terminating resistor. In other words, when the Nyquist frequency of the high-frequency signal increases, the semiconductor chip CHP1 having the semiconductor laser LD formed therein and the chip resistor SMD (terminating resistor) used for the impedance matching cannot be used as a lumped parameter circuit, and the necessity to use them as a distributed parameter circuit increases.

Regarding this, it is considered that this problem may be solved by simply putting the semiconductor chip CHP1 having the semiconductor laser LD formed therein and the chip resistor SMD close to each other. However, as seen in the second embodiment, when the chip resistor SMD (chip component) is used as the resistor R used for the characteristic impedance matching, the problem of the mounting accuracy of the chip resistor SMD arises.

For example, in the second embodiment, when the effective wavelength of the high-frequency signal calculated from the Nyquist frequency of the high-frequency signal is assumed to be "$\lambda e$", the distance "L1" (see FIG. 8) between the end portion of the semiconductor chip CHP1 and one end portion of the chip resistor SMD (end portion thereof facing the semiconductor chip CHP1) is desirably equal to or smaller than "$\lambda e/8$". However, when the frequency of the high-frequency signal is extremely high, the effective wavelength "$\lambda e$" is extremely small, and therefore, "$\lambda e/8$" becomes an extremely small value. As a result, this value "$\lambda e/8$" may be smaller than the mounting accuracy of the chip resistor SMD. In this case, when the chip resistor SMD (chip component) is used as the resistor R used for the characteristic impedance matching, the chip resistor SMD cannot be put close to the semiconductor chip CHP1 as close as the length of the wiring WL1A between the semiconductor chip CHP1 having the semiconductor laser LD formed therein and the chip resistor SMD is ignorable, because of the mounting accuracy of the chip resistor SMD. Therefore, for example, when the frequency of the high-frequency signal is extremely high, even if the chip resistor SMD (chip component) is used as the resistor R used for the characteristic impedance matching, the multiple reflection undesirably occurs in the wiring WL1A between the semiconductor chip CHP1 and the chip resistor SMD (terminating resistor), which results in weakening the effect of the chip resistor SMD functioning as the terminating resistor.

Further, the chip resistor SMD contains the unignorable parasitic capacitance and parasitic inductance, and therefore, when the frequency of the high-frequency signal is higher, it is difficult to obtain the desirable characteristic impedance. In addition, in an attempt to achieve a characteristic impedance matching circuit from a plurality of chip components in order to avoid the influences of the parasitic capacitance and the parasitic inductance, a problem of increase in a mounting cost arises.

As described above, for the purpose of maintaining the signal quality, the configuration with the usage of the chip resistor SMD (chip component) as the resistor R used for the characteristic impedance matching is useful when, for example, the high-frequency signal having such a frequency as making the value "$\lambda e/8$" larger than the mounting accuracy of the chip resistor SMD is handled. However, when, for example, a high-frequency signal having such a frequency as making the value "$\lambda e/8$" smaller than the mounting accuracy of the chip resistor SMD is handled, even if the chip resistor SMD (chip component) is used as the resistor R used for the characteristic impedance matching, the deterioration of the signal quality (deterioration of the signal waveform) cannot be effectively suppressed. Therefore, when, for example, a high-frequency signal having such a Nyquist frequency as exceeding 12.5 GHz is handled, it is desirable to form the resistor R from a structure body capable of being arranged close to the semiconductor chip CHP1 having the semiconductor laser LD formed therein, as the resistor R used for the characteristic impedance matching.

Accordingly, in the present third embodiment, such devisal as forming the resistor R capable of being arranged close to the semiconductor chip CHP1 by a distance smaller than the mounting accuracy of the chip resistor SMD has been made. A technical concept in the present third embodiment to which this devisal has been made will be described below.

<Outline of Technical Concept in Third Embodiment>

A feature of the technical concept in the present third embodiment is to, for example, adopt a thin film resistor as the terminating resistor (resistor R) that compensates the characteristic impedance of the semiconductor laser. Such a thin film resistor can be formed by using, for example, a photolithography technique. Therefore, a forming position of the thin film resistor can be achieved with accuracy in the photolithography technique that is much higher than the mounting accuracy of the chip resistor. From this reason, because the thin film resistor is used as the terminating resistor that compensates the characteristic impedance of the semiconductor laser, the structure body capable of being arranged close to the semiconductor chip having the semiconductor laser formed therein can be achieved so as to have a distance that is much smaller than the mounting accuracy of the chip resistor.

<Configuration of Semiconductor Device>

Figure 12:
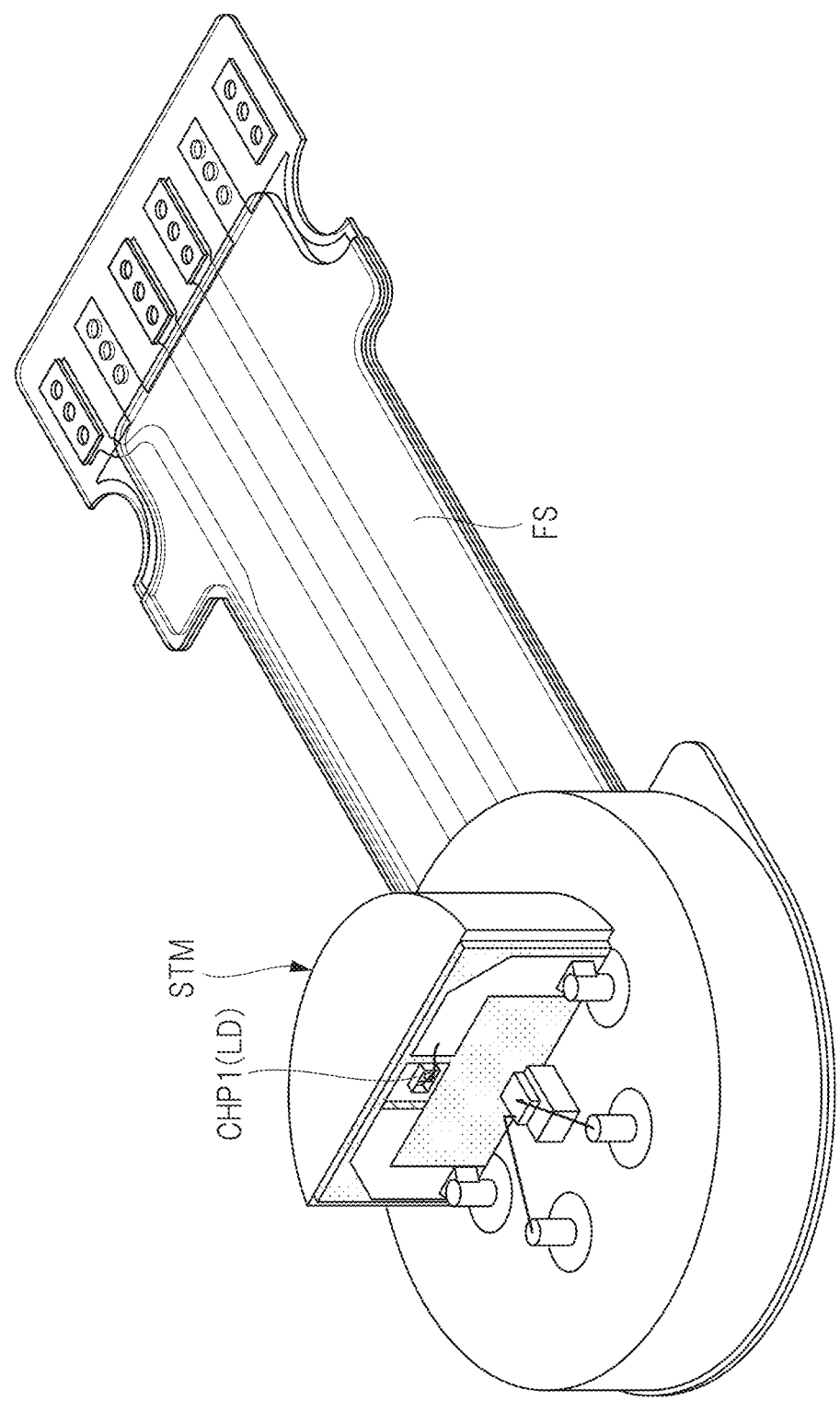
FIG. 12 is a perspective view schematically showing a stem and a flexible substrate configuring a part of the semiconductor device.

FIG. 12 is a perspective view schematically showing the stem STM and the flexible substrate FS configuring a part of the semiconductor device. In FIG. 12, the stem STM and the flexible substrate FS are the parts corresponding to the route through which the high-frequency signal (high-speed signal) inside the semiconductor device is transmitted. While the semiconductor chip CHP1 having the semiconductor laser LD formed therein is mounted on the stem STM, the DC/RF signal line is formed on the flexible substrate FS.

Figure 13:
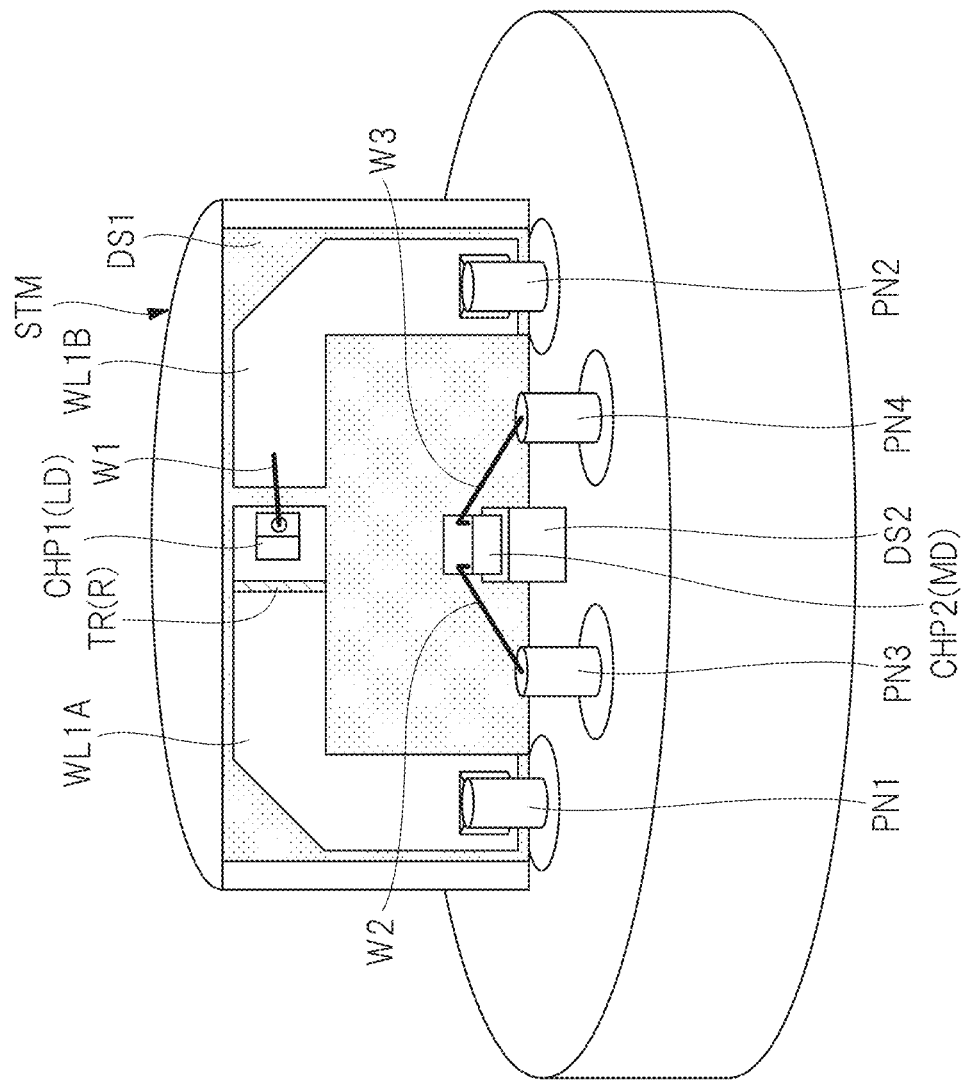
FIG. 13 is a diagram showing a detailed configuration of the stem.

Next, FIG. 13 is a diagram showing a detailed configuration of the stem STM. A configuration of the stem STM in the present third embodiment shown in FIG. 13 is almost the same as the configuration of the stem STM in the second embodiment shown in FIG. 7, and therefore, a difference will be mainly described.

In the stem STM in the second embodiment shown in FIG. 7, the chip resistor SMD is adopted as the resistor R that compensates the characteristic impedance of the semiconductor laser LD, and the chip resistor SMD is mounted near the semiconductor chip CHP1 mounted over the wiring WL1A. On the other hand, in the stern STM in the present third embodiment shown in FIG. 13, a thin film resistor TR is adopted as the resistor R that compensates the characteristic impedance of the semiconductor laser LD, and the thin film resistor TR is formed near the semiconductor chip CHP1 mounted over the wiring WL1A.

Figure 14:
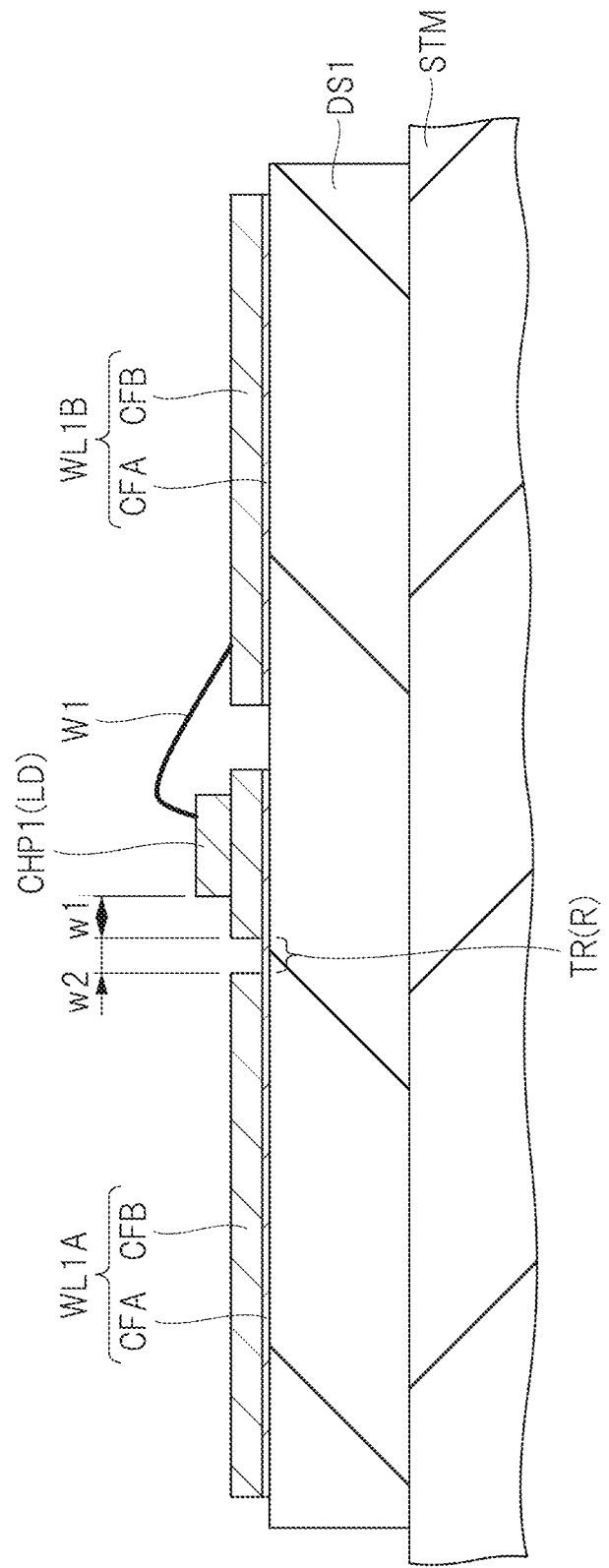
FIG. 14 is a cross-sectional view schematically showing a specific configuration example of a thin film resistor.

Next, a specific configuration example of the thin film resistor TR will be described. FIG. 14 is a cross-sectional view schematically showing a specific configuration example of the thin film resistor IR. As shown in FIG. 14, over the dielectric substrate DS1 arranged in the stem STM, the wiring WL1A and the wiring WL1B are formed. Over the wiring WL1A, the semiconductor chip CHP1 having the semiconductor laser LD formed therein is mounted. Meanwhile, the wiring WL1B and the semiconductor chip CHP1 are electrically connected to each other through the wire W1. Each of the wiring WL1A and the wiring WL1B is made of a conductive film CFA and a conductive film CFB formed over the conductive film CFA.

At this time, the wiring WL1A is configured of a first portion made of the conductive film CFA and a second portion including the conductive film CFB thicker than the conductive film CFA, and the first portion of the wiring WL1A configures the thin film resistor TR. That is, since a resistivity of the conductive film CFA is larger than a resistivity of the conductive film CFB, the first portion made of the conductive film CFA functions as the thin film resistor TR. On the other hand, the second portion of the wiring WL1A is made of the conductive film CFA and the conductive film CFB formed over the conductive film CFA, and the second portion of the wiring WL1A functions as a signal transmission layer (signal wiring) through which the high-frequency signal is transmitted. In the manner, the wiring WL1 in the present third embodiment has the first portion functioning as the thin film transistor TR and the second portion functioning as the signal wiring, and the first portion is formed so as to divide the second portion. That is, the wiring WL1A in the present third embodiment has a structure in which the signal wiring and the thin film resistor TR are formed to be unified. In the present third embodiment, this thin film resistor TR functions as the terminating resistor that compensates the characteristic impedance of the semiconductor laser LD formed on the semiconductor chip CHP1.

<Feature in Third Embodiment>

Next, a feature in the present third embodiment will be described. As the feature in the present third embodiment, for example, as shown in FIG. 14, a first portion made of only the conductive film CFA configuring a part of the wiring WL1A and having a high resistivity is formed, and this first portion functions as the thin film resistor TR to be the terminating resistor that compensates the characteristic impedance of the semiconductor laser LD formed on the semiconductor chip CHP1.

In the manner, according to the present third embodiment, the following merit can be obtained. For example, if the length of the wiring WL1A between the semiconductor chip CHP1 having the semiconductor laser LD formed therein and the terminating resistor is not sufficiently shorter than the wave length of the high-frequency signal (electromagnetic wave) that is shortened by the high frequency of the high-frequency signal, the wiring WL1A between the semiconductor chip CHP1 and the terminating resistor has to be undesirably considered as the transmission line. At this time, since the multiple reflection occurs in the wiring WL1A that is considered as the transmission line connecting the terminating resistor and the semiconductor chip CHP1, the effect of the terminating resistor is reduced. Regarding this, according to the feature in the present third embodiment, when the thin film resistor TR is previously formed in the wiring WL1A formed over the dielectric substrate DS1, a distance between the semiconductor chip CHP1 and the thin film resistor TR can be shortened to be a distance that is much smaller than the mounting accuracy of the chip resistor. As a result, according to the feature in the present third embodiment, the length of the wiring WL1A between the semiconductor chip CHP1 having the semiconductor laser LD formed therein and the thin film resistor TR (terminating resistor) can be sufficiently shorter than the wave length of the high-frequency signal (electromagnetic wave) that is shortened by the high frequency of the high-frequency signal. Therefore, according to the feature in the present third embodiment, the multiple reflection between the semiconductor chip CHP1 and the thin film resistor TR (terminating resistor) can be suppressed. As a result, the deterioration of the signal quality (deterioration of the signal waveform) due to the multiple reflection can be suppressed.

Further, for example, when the chip resistor that is the chip component is used as the terminating resistor, it is difficult to match the characteristic impedance particularly in a high frequency band because of influence of a parasitic reactance caused by a pad capacitance and a physical dimension. On the other hand, in the present third embodiment, a step of forming the wiring WL1A over the dielectric substrate DS1 on which the semiconductor chip CHP1 is mounted has been devised so as to adopt a configuration in which the thin film resistor TR is inserted in the middle of the wiring WL1A. A parasitic reactance of the thin film resistor TR formed as described above is much smaller than a parasitic reactance of the chip resistor, so that a parasitic reactance of the terminating resistor can be suppressed. From this reason, according to the feature in the present third embodiment, the terminating resistor can be made of the thin film resistor TR having the small parasitic reactance. As a result, a merit that makes the characteristic impedance matching easy in the high frequency band can be obtained.

As shown in FIG. 14, in the present third embodiment, note that a distance between the end portion of the semiconductor chip CHP1 and one end portion of the thin film resistor TR (end portion thereof facing the semiconductor chip CHP1) is assumed to be "w1". For example, when the effective wavelength of the high-frequency signal calculated from the Nyquist frequency of the high-frequency signal is assumed to be "λe", this distance "w1" is desirable to be equal to or smaller than "λe/8". This is because, if the length of the wiring WL1A between the semiconductor laser LD and the thin film resistor TR (terminating resistor) is not sufficiently shorter than the wave length of the high-frequency signal (electromagnetic wave), the multiple reflection undesirably occurs in this wiring WL1A, which results in weakening the effect of the thin film resistor TR functioning as the terminating resistor.

Further, as shown in FIG. 14, when a length of the thin film resistor TR is assumed to be "w2", this length "w2" of the thin film resistor TR is desirable to be equal to or smaller than "λe/16". This is because the large length of the thin film resistor TR causes the influence of the parasitic reactance, and therefore, it is difficult to adjust the characteristic impedance of the thin film resistor TR to be a desirable value when a high-frequency signal having a higher frequency is handled.

<Grounds on "λe/8">

Subsequently, the foil owing is the explanation of the grounds why, for example, the distance "w1" between the end portion of the semiconductor chip CHP1 and one end portion of the thin film resistor TR is desirable to be equal to or smaller than "λe/8" when the effective wavelength of the high-frequency signal calculated from the Nyquist frequency of the high-frequency signal is assumed to be "λe".

General y, when the physical dimension of the circuit configured of the element and the transmission line is sufficiently smaller than the wave length of the electromagnetic wave (high-frequency signal) transmitting through the circuit, the element and the transmission line in the circuit can be handled in terms of lumped parameter. Therefore, it is necessary to consider a dimension and a position of the thin film resistor TR inserted for compensating the low characteristic impedance of the semiconductor laser LD in accordance with a frequency of a handled signal. Accordingly, first, how the signal quality changes in change of the distance between the semiconductor chip CHP1 having the semiconductor laser LD formed therein and the thin film resistor TR has been studied.

First, a designing outline of the thin film resistor TR will be described. In order to achieve a resistance value of about several tens of Ω in the thin film resistor TR having a small sheet resistance, it is necessary to elongate a planar shape. However, in this case, there is a risk of reduction in the signal quality because of the occurrence of the parasitic reactance due to unnecessary current concentration and the physical dimension. From the reason, in consideration of the influence of the physical dimension of the thin film resistor TR on the signal quality, it is reasonable to use a thin film resistance material having a sheet resistance value that is equal to or larger than 10 Ω/sq. Therefore, in the present third embodiment, for example, the material of the thin film resistor TR is made of tantalum nitride (TaN) having a volume resistivity of 100 μΩ·cm and a thickness of 20 nm (sheet resistivity of 50 Ω/sq). Each of tantalum nitride (TaN) and nickel chrome (NiCr) has a volume resistivity that is one digit higher than that of a general metallic material, and therefore, is useful since the sheet resistance that is equal to or larger than 10 Ω/sq. can be easily obtained by controlling a thickness of the formed film. While a width of the thin film resistor TR is fixed so as to match a width of the transmission line, a length of the thin film resistor TR is designed so that the resistance value of the thin film resistor TR is 25 Ω.

Next, a maximum value and a minimum value of the resistance value of the thin film resistor TR will be described. For example, when the differential impedance of the transmission line TL1 is assumed to be "$Z_{diff}$" and the differential impedance of the semiconductor laser LD is assumed to be "$Z_{LD}$" while the designed resistance value of the thin film resistor TR is "$R_t$", a reflectivity coefficient "Γ" is expressed by the following equation (1).

$$\Gamma = \{(Z_{LD}+R_t)-Z_{diff}\}/\{(Z_{LD}+R_t)+Z_{diff}\} \qquad \text{Equation (1)}$$

Therefore, the maximum value ("$R_{tmax}$") of the resistance value of the thin film resistor TR is defined by the value "$R_t$" under an impedance matching condition (Γ=0). In the present third embodiment, "$Z_{diff}$" is 50Ω while "$Z_{LD}$" is 10Ω, and therefore, "$R_t$" under the impedance matching condition is 40Ω. The resistance value of the thin film resistor TR can be set to be equal to or larger than "$R_t$" under an impedance matching condition (($Z_{LD}+R_t)=Z_{diff}$, that is Γ=0). However, for a purpose of the suppression of the heat generation in the thin film resistor TR and a purpose of the reduction in the power consumption in the thin film resistor TR, "$R_t$" is desirably as small as possible. Accordingly, in consideration of the role as the terminating resistor, the minimum value ("$R_{tmin}$") of the resistance value of the thin film resistor TR is defined by "$R_t$" obtained when Γ is allowed up to 25%. In the present third embodiment, "$R_t$" is 25Ω, "$Z_{diff}$" is 50Ω and "$Z_{LD}$" is 10Ω, and therefore, Γ≅17.6%, and thus, the above-described condition is satisfied.

A three-dimensional model (3-D model) of the transmission small optical device (TOSA) has been electromagnetically analyzed on the basis of the designing outline as described above, and the signal quality of the current flowing through the semiconductor laser LD has been evaluated by usage of a linear model of the semiconductor laser LD and a circuit simulator. At this time, as an input signal to the TOSA, a 25 Gbps-NRZ signal having rising time of 15 psec has been set. A 3-D electromagnetic models obtained when the distance between the semiconductor laser LD and the thin film resistor TR is changed in a range from 0.05 nm to 1.6 mm has been produced and analyzed. The distance "0.05 mm" corresponds to an achievable distance in consideration of the mounting accuracy of the semiconductor chip CHP1 having the semiconductor laser LD formed therein. On the other hand, the distance "1.6 mm" nearly corresponds to a limit of an insertable position into the wiring WL1A that has been studied at this time.

Figure 15A:
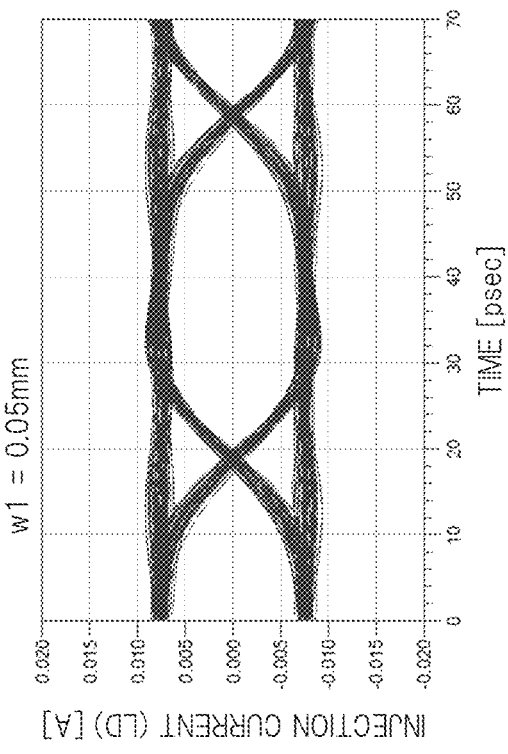
FIG. 15A is a diagram showing a 25 Gbps-Eye waveform obtained when impedance matching is not performed by the thin film resistor.
Figure 15B:
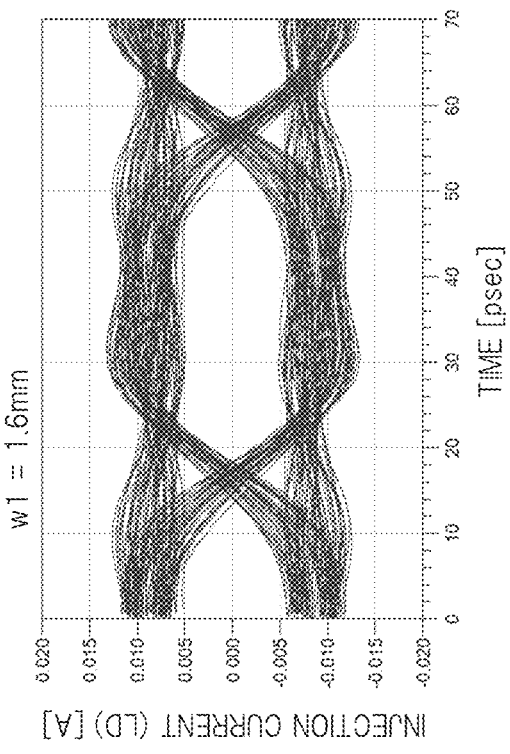
FIG. 15B is a diagram showing a 25 Gbps-Eye waveform obtained when the thin film resistor is inserted at a position that is 0.05 mm away from an end portion of the semiconductor chip.

First, FIG. 15A shows a 25 Gbps-Eye waveform obtained when the impedances are not matched using the thin film resistor TR. On the other hand, FIG. 15B shows a 25 Gbps-Eye waveform obtained when the thin film resistor TR is inserted at a position that is 0.05 mm away from, the end portion of the semiconductor chip CHP1. As shown, in FIG. 15A, a jitter in the case without the insertion of the thin film resistor TR is 6.92 psec. On the other hand, as shown in FIG. 15B, a jitter in the case with the insertion of the thin film resistor TR at the position that is 0.05 mm away from, the end portion of the semiconductor chip CHP1 is 3.07 psec. From this, it has been found out that the litter is about 55% better in the case with the insertion of the thin film resistor TR at the position that is 0.05 mm away from the end portion of the semiconductor chip CHP1 than the case without the insertion of the thin film resistor TR. Meanwhile, in both the cases without the insertion of the thin film resistor TR and with the insertion of the thin film resistor TR at the position that is 0.05 mm away from the end portion of the semiconductor chip CHP1, an Eye-opening height has been 12.7 mA so that its change has not been observed. As seen in the above-described results, the thin film resistor TR inserted at the position that is 0.05 mm away from the end portion of the semiconductor chip CHP1 sufficiently functions as the terminating resistor.

Figure 15C:
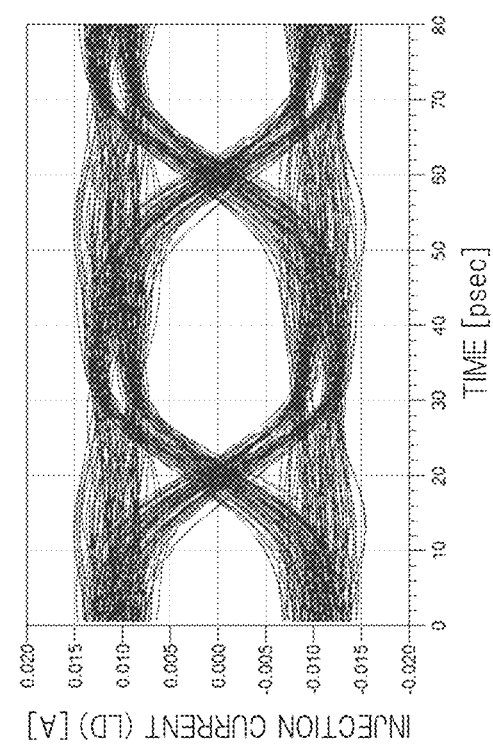
FIG. 15C is a diagram showing a 25 Gbps-Eye waveform obtained when the thin film resistor is inserted at a position that is 1.2 mm away from the end portion of the semiconductor chip.
Figure 15D:
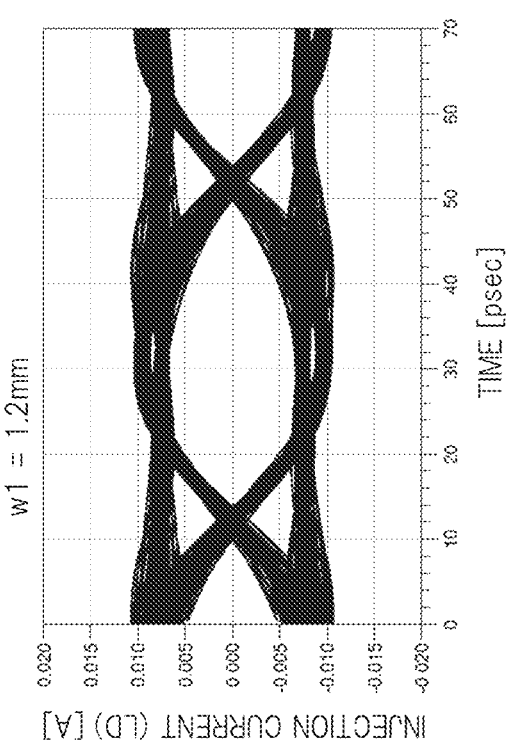
FIG. 15D is a diagram showing a 25 Gbps-Eye waveform obtained when the thin film resistor is inserted at a position that is 1.6 mm away from the end portion of the semiconductor chip.

Subsequently, FIG. 15C shows a 25 Gbps-Eye waveform in a case with the insertion of the thin film resistor TR at a position that is 1.2 mm away from the end portion of the semiconductor chip CHP1. Meanwhile, FIG. 15D shows a 25 Gbps-Eye waveform in a case with the insertion of the thin film resistor TR at a position that is 1.6 mm away from the end portion of the semiconductor chip CHP1. At this time, as shown in FIG. 15C, a jitter in the case with the insertion of the thin film resistor TR at the position that is 1.2 mm away from the end portion of the semiconductor chip CHP1 is 4.30 psec. On the other hand, as shown in FIG. 15D, a jitter in the case with the insertion of the thin film resistor TR at the position that is 1.6 mm away from the end portion of the semiconductor chip CHP1 is 5.12 psec. In the manner, it can be said that both the jitters in the case with the insertion of the thin film resistor TR at the position that is 1.2 mm away from the end portion of the semiconductor chip CHP1 and the case with the insertion of the thin film resistor TR at the position that is 1.6 mm away from the end portion of the semiconductor chip CHP1 are more improved than the jitter in the case without the insertion of the thin film resistor TR. However, when it is considered that the jitter in the case with the insertion of the thin film resistor TR at the position that is 0.05 mm away from the end portion of the semiconductor chip CHP1 is 3.07 psec, it has been found out that a large distance between the semiconductor chip CHP1 and the thin film resistor TR increases the jitter. And, an Eye-opening height in the case without the insertion of the thin film resistor TR has been 12.7 mA. On the other hand, an Eye-opening height in the case with the insertion of the thin film resistor TR at the position that is 1.2 mm away from the end portion of the semiconductor chip CHP1 has been 10.9 mA, and an Eye-opening height in the case with the insertion of the thin film resistor TR at the position that is 1.6 mm away from the end portion of the semiconductor chip CHP1 has been 10.1 mA, and therefore, it has been found out that the Eye-opening height deteriorates. This opening height deterioration is caused by influence of reduction in a DC current (direct current) value and influence of reflection due to the insertion of the thin film resistor TR.

Figure 16:
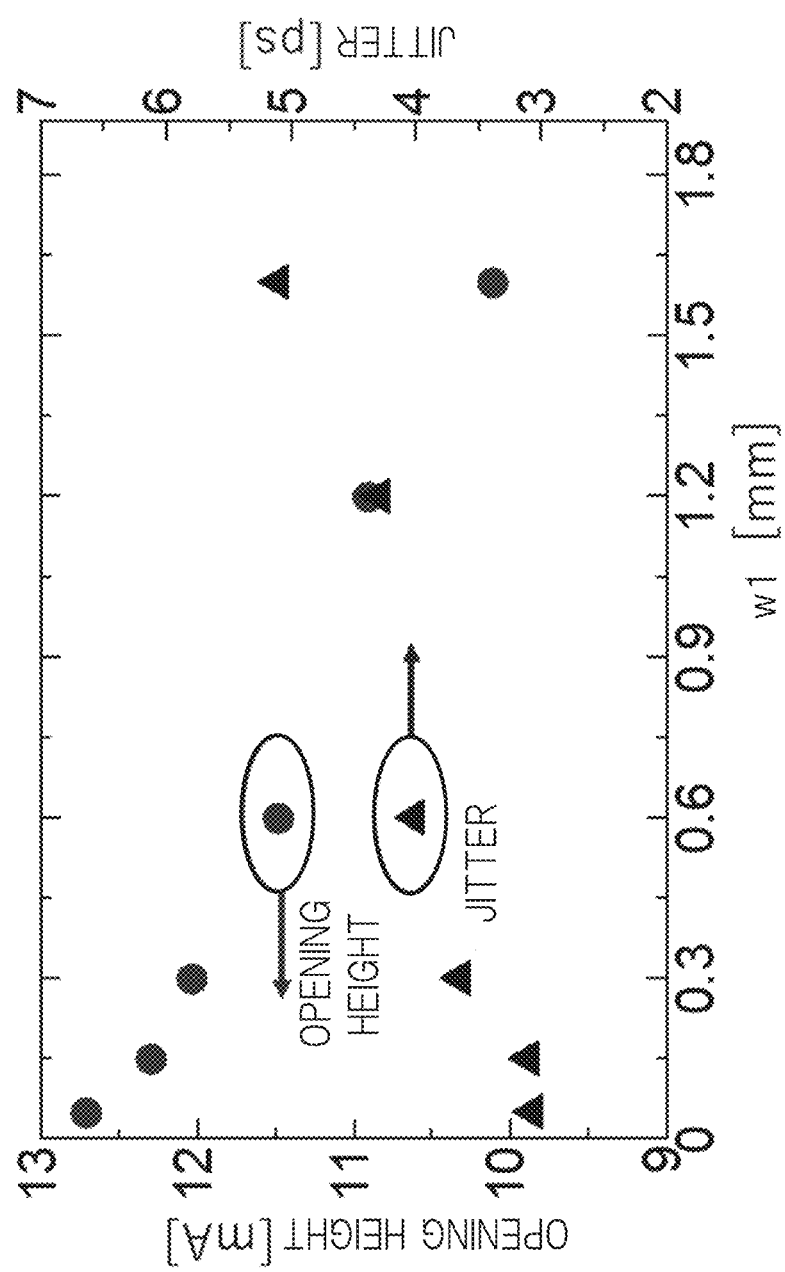
FIG. 16 is a graph summarizing a jitter and an Eye-opening height calculated from the 25 Gbps-Eye waveform with respect to a distance between the semiconductor chip and the thin film resistor.

FIG. 16 is a graph summarizing the jitter and the Eye-opening height calculated from the 25 Gbps-Eye waveform with respect to the distance ("w1") between the semiconductor chip CHP1 and the thin film resistor TR. As shown in FIG. 16, it has been found out that the jitter is larger and the Eye-opening height is smaller while the distance ("w1") between the semiconductor chip CHP1 and the thin film resistor TR is larger. Both the large jitter and the small Eye-opening height mean the deterioration of the signal quality. From the reason, it has been found out from FIG. 16 that the large distance ("w1") between the semiconductor chip CHP1 and the thin film resistor TR causes the deterioration of the signal quality.

Next, while these results will be discussed, necessary physical amounts will be described before the discussion. For example, when a wiring width of a micro-strip line is assumed to be "W" and a thickness of the dielectric substrate is assumed to be "d", an effective relative permittivity "$\varepsilon_e$" in a case in which "W/d >1.0" is satisfied is analytically expressed by the following equation (2).

$$\varepsilon_e = (\varepsilon_r+1)/2 + (\varepsilon_r-1)/2 \times 1/\sqrt{(1+12d/W)} \quad \text{Equation (2)}$$

Here, "$\varepsilon_r$" is a relative permittivity of a plate-shaped dielectric substrate. When the Nyquist frequency of the signal is assumed to be "$f_N$", an effective wavelength "$\lambda e$" of electromagnetic wave transmitting through the micro-strip line wiring over the dielectric substrate is expressed by the following equation (3) using the effective relative permittivity "$\varepsilon_e$" obtained in the equation (2).

$$\lambda e = c/(\sqrt{\varepsilon_e} \cdot f_N) \quad \text{Equation (3)}$$

Here, "c" indicates a speed of light.

A value "W/d" in the analyzed model is about 3. When the effective wavelength "$\lambda e$" of the 25 Gbps signal ($f_N$=12.5 GHz) is calculated using the equations (2) and (3) in assumption that a permittivity of aluminum nitride (AlN) that is a constituent material of the dielectric substrate is 8.6, the effective wavelength "$\lambda e$" is about 9.5 mm. In this analysis, the distance of 0.05 mm that is the closest position from the semiconductor chip CHP1 corresponds to a length that is about 1/20 times the effective wavelength. Therefore, if the thin film resistor TR can be inserted at the position that is about 1/20 of the effective wavelength "$\lambda e$" calculated from the Nyquist frequency away therefrom, the thin film resistor TR sufficiently functions as the terminating resistor. In other words, when the semiconductor chip CHP1 and the thin film resistor TR are made close to each other so that the distance therebetween is the mounting accuracy of the semiconductor chip CHP1, the thin film resistor TR sufficiently functions as the terminating resistor.

However, up to about 1.2 mm corresponding to about "$\lambda e/8$", the effect of the improvement of the jitter is larger than the deterioration of the Eye-opening height. Therefore, even if the distance between the semiconductor chip CHP1 and the thin film resistor TR is about. "$\lambda e/8$", the thin film resistor TR sufficiently functions as the terminating resistor used for the impedance matching. In the manner described above, for example, for a purpose of causing the thin film resistor TR to sufficiently function as the terminating resistor used for the impedance matching, it has been found out that the distance between the end portion of the semiconductor chip CHP1 having the semiconductor laser LD formed therein and the thin film, resistor TR is desirably larger than 0 and equal to or smaller than "$\lambda e/8$".

<Method of Forming Thin Film Resistor>

Next, a method of forming the thin film resistor in the present third embodiment will be described with reference to the drawings. A step of forming the thin film resistor TR in the present third embodiment is performed in, steps of manufacturing an electronic device described below. Specifically, the steps of manufacturing the electronic device include: a step of manufacturing the semiconductor device SA1; a step of preparing the mounting substrate PCB having the transmission line TL1 formed therein; and a step of preparing the semiconductor component (semiconductor device SA2) including the semiconductor chip having the driving circuit for driving the semiconductor laser LD formed therein. Further, the steps of manufacturing the electronic device include: a step of mounting the semiconductor device SA1 over the mounting substrate PCB so that the semiconductor device SA1 and the transmission line TL1 are electrically connected to each other; and a step of mounting the semiconductor component over the mounting substrate PCB so that the semiconductor component (semiconductor device SA2) and the transmission line TL1 are electrically connected to each other. Here, the semiconductor device SA1 includes the wiring substrate (dielectric substrate DS1) having the wiring WL1A formed therein. At this time, the wiring WL1A is made of a first portion configured of a first conductive pattern and a second portion including a second conductive pattern that is thicker than the first conductive pattern. The step of forming the thin film resistor TR is performed in the step of manufacturing the semiconductor device SA1.

Figure 17:
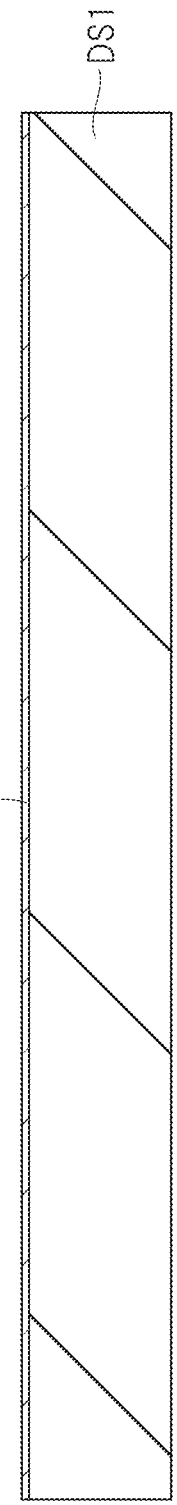
FIG. 17 is a cross-sectional view for explaining a step of forming a thin film resistor in a third embodiment.

Specifically, the step of forming the thin film resistor TR will be described below. First, as shown in FIG. 17, the conductive film CFA is formed over the dielectric substrate DS1 by, for example, a vacuum vapor deposition method or a sputtering method. The conductive film CFA can be made of, for example, a tantalum nitride film (TaN film) or a nickel chromium film (NiCr film)

Next, as shown in FIG. 18, the conductive film CFA is patterned by a lift-off method. Subsequently, as shown in FIG. 19, the conductive film CFB made of, for example, a lamination layer of a nickel film, a platinum film and a gold film is formed so as to cover the patterned conductive film CFA by a vacuum vapor deposition method or a sputtering method. Then, as shown in FIG. 20, the conductive film CFB is patterned by, for example, a lift-off method. In the manner, the dielectric substrate DS1 having a cross-sectional structure as shown in FIG. 20 can be manufactured. Here, in FIG. 20, each of the wiring WL1A and the wiring WL1B (second portion) is made of the lamination film of the conductive film CFA and the conductive film CFB. On the other hand, the first portion from which the conductive film CFA is exposed and which is made of the single conductive film CFA functions as the thin film resistor TR.

In the manner as described above, the wiring WL1A including the thin film resistor TR can be formed over the dielectric substrate DS1. Then, as shown in FIG. 21, over the wiring WL1A, the semiconductor chip CHP1 having the semiconductor laser LD formed therein is mounted.

In the above-described step of forming the thin film resistor TR, the example using the lift-off method and the vacuum vapor deposition method or the sputtering method in combination has been described. However, the method is not limited to these methods, and the thin film resistor TR can be formed even by a method of, for example, forming a pattern of a seed layer first, and then, using an electrolyte plating method. Specifically, for example, over the dielectric substrate (wiring substrate) DS1, a seed layer (conductive film CFA) made of, for example, a nickel film (Ni film), a platinum film (Pt film) a chromium film (Cr film), a titanium film (Ti film), a tin film (Sn film), a palladium film (Pd film) a silver film, (Ag film), a copper film (Cu film), a lamination film of two or more types of these metals in combination or others is formed. Then, this seed layer is patterned. Subsequently, after a mask for covering the seed layer of the first portion is formed, the electrolyte plating method using the seed layer s performed in a state of the formation of this mask, so that the conductive film CFB is formed over the seed layer of the second portion. In the manner, the wiring WL1A including the thin film resistor TR and the wiring WL1B can be also formed by the electrolyte plating method. When titanium (Ti) having a volume resistivity of, for example, about 50 μΩ·cm is used for the seed layer, the thin film resistor TR having a thickness of 25 nm and a sheet resistance value of 20 Ω/sq. can be formed. Further, when a shape of a resist film (mask) in the electrolyte plating step for forming a gold film is adjusted, the thin film resistor TR having an optional resistance value can be formed.

FIRST MODIFICATION EXAMPLE

The section of the above-described third embodiment has described the example of the format on of the wiring WL1A including the thin film resistor TR over the dielectric substrate DS1 by patterning the conductive film CFA to be the thin film resistor TR, and then, forming and patterning the conductive film CFB functioning as the signal transmitting layer over the patterned conductive film CFA. However, the formation method is not limited to this method. For example, the dielectric substrate DS1 on which the wiring WL1A including the thin film resistor TR is formed can be also manufactured by separately designing the pattern of the thin film resistor TR from the signal transmitting layer.

Specifically, for example, after the pattern of the thin film resistor TR is formed as shown in FIG. 22, the conductive film CFB functioning as the signal transmitting layer is formed as shown in FIG. 23, and then, the conductive film CFB is patterned as shown in FIG. 24. In the manner, the second portion of the wiring WL1A made of the conductive film CFB and the first portion of the wiring WL1A made of the thin film resistor TR can be formed.

SECOND MODIFICATION EXAMPLE

Alternatively, for example, after the conductive film CFF is formed over the dielectric substrate DS1 as shown in FIG. 25, the conductive film OFF is patterned as shown in FIG. 26, so that the wiring WL1A and the wiring WL1B made of the conductive film CFB are formed. Then, the conductive film CFA is formed so as to cover the wiring WL1A and the wiring WL1B as shown in FIG. 27, and the conductive film CFA is patterned as shown in FIG. 28. In the manner, the thin film resistor TR made of the conductive film CFA can be formed.

THIRD MODIFICATION EXAMPLE

In the third embodiment, for example, as shown in FIG. 13, the thin film resistor TR is formed in the wiring WL1A on which the semiconductor chip CHP1 is mounted in order to verify the effect of the thin film resistor TR obtained when the distance between the semiconductor chip CHP1 having the semiconductor laser LD formed therein and the thin film resistor TR is the shortest. However, the technical concept in the third embodiment is not limited to this. For example, as shown in FIG. 29, the thin film resistor TR can be also formed in the wiring WL1A connected to the semiconductor chip CHP1 through the wire W1.

It is very important to consider the signal quality of the high-frequency signal. However, a luminance efficiency and a bandwidth of the semiconductor laser LD are smaller while a temperature of the semiconductor chip CHP1 having the semiconductor laser LD formed therein is higher, and therefore, it is also important to control heat in vicinity of the semiconductor chip CHP1 for a purpose of long-distance transmission. That is, for a purpose of improvement of the signal quality of the high-frequency signal, it is desirable to put the thin film resistor TR close to the semiconductor chip CHP1 having the semiconductor laser LD formed therein as much as possible. Meanwhile, since the thin film resistor TR becomes a heat source due to the Joule heat, and therefore, it is necessary to pay attention to putting the thin film resistor TR close to the semiconductor chip CHP1 for the purpose of the suppression of the increase in the temperature of the semiconductor chip CHP1 to suppress the decreases in the luminance efficiency and the bandwidth of the semiconductor laser LD. Therefore, for example, according to the configuration of the present third modification example as shown in FIG. 29, a route having a high conductivity between the semiconductor chip CHP1 having the semiconductor laser LD formed therein and the thin film resistor TR is only the thin wire W1, and therefore, the heat generated in the thin film resistor TR is more difficult to conduct to the semiconductor chip CHP1 than that of the configuration of FIG. 13. As a result, according to the configuration of the present third modification example as shown in FIG. 29, an effect that is easier to suppress the increase in the temperature of the semiconductor chip CHP1 than the configuration of the third embodiment shown in FIG. 13 can be obtained.

Particularly, in FIG. 30, also in the present third modification example, the distance ("w3") between the semiconductor chip CHP1 and the thin film resistor TR is desirably equal to or smaller than "$\lambda e/8$" for the purpose of keeping the signal quality of the high-frequency signal. Further, in FIG. 30, the length ("w4") of the thin film resistor TR is desirably equal to or smaller than "$\lambda e/16$".

In the foregoing, the invention made by the present inventors has been concretely described based on the embodiments. However, it is needless to say that the present invention is not limited to the foregoing embodiments and various modifications and alterations can be made within the scope of the present invention.

The invention claimed is:

1. An electronic device comprising:
a first semiconductor chip having a driving circuit for driving a semiconductor laser;
a transmission line electrically connected to the first semiconductor chip; and
a semiconductor device electrically connected to the transmission line,
wherein the semiconductor device includes:
a wiring electrically connected to the transmission line;
a resistor connected to the wiring; and
a second semiconductor chip having the semiconductor laser, the semiconductor laser electrically connected to the resistor,
wherein the wiring comprises:
a first portion made of a first conductive layer; and
a second portion including a second conductive layer thicker than the first conductive layer, and
wherein the first portion is the resistor.

2. The electronic device according to claim 1, wherein the second semiconductor chip is mounted over the wiring.

3. The electronic device according to claim 1, wherein the second portion is configured of:
the first conductive layer; and
the second conductive layer formed over the first conductive layer.

4. The electronic device according to claim 1, wherein the second portion is configured of the second conductive layer.

5. The electronic device according to claim 1, wherein the first portion divides the second portion.

6. The electronic device according to claim 1, wherein a resistivity of the first conductive layer is larger than a resistivity of the second conductive layer.

7. The electronic device according to claim 1, wherein the resistor is a terminating resistor used for matching a characteristic impedance of the semiconductor laser and a characteristic impedance of the wiring.

8. The electronic device according to claim 1, wherein the wiring is connected to the second semiconductor chip through a wire.

9. The electronic device according to claim 1,
wherein the resistor is a chip component,
wherein the chip component is mounted on the wiring through a bonding material, and
wherein the bonding material does not contain flux.

10. An electronic device comprising:
a first semiconductor chip having a driving circuit for driving a semiconductor laser;
a transmission line electrically connected to the first semiconductor chip; and
a semiconductor device electrically connected to the transmission line,
wherein the semiconductor device includes:
a wiring electrically connected to the transmission line;
a resistor connected to the wiring; and
a second semiconductor chip having the semiconductor laser, the semiconductor laser being electrically connected to the resistor,
wherein, when an effective wavelength of a signal calculated on the basis of a Nyquist frequency of the signal transmitting through the wiring is assumed to be "$\lambda e$", a distance between a connected end portion of the second semiconductor chip connected to the wiring and one end portion of the resistor is larger than 0 and equal to or smaller than $\lambda e/8$.

11. The electronic device according to claim 10, wherein a length of the resistor in an extending direction of the wiring is equal to or smaller than $\lambda e/16$.

12. The electronic device according to claim 10, wherein a distance between the first semiconductor chip and the second semiconductor chip is larger than $\lambda e/8$.

13. A method of manufacturing an electronic device including:
a first semiconductor chip having a driving circuit for driving a semiconductor laser formed therein;
a transmission line electrically connected to the first semiconductor chip; and
a semiconductor device electrically connected to the transmission line,
the semiconductor device including:
a wiring electrically connected to the transmission line;
a resistor connected to the wiring; and
a second semiconductor chip having the semiconductor laser, the semiconductor laser electrically connected to the resistor,
the method comprising the steps of:
(a) manufacturing the semiconductor device;
(b) preparing a mounting substrate having the transmission line formed therein;
(c) preparing a semiconductor component including the first semiconductor chip;
(d) mounting the semiconductor device over the mounting substrate so that the semiconductor device and the transmission line are electrically connected to each other; and
(e) mounting the semiconductor component over the mounting substrate so that the semiconductor component and the transmission line are electrically connected to each other,
wherein the semiconductor device includes a wiring substrate having the wiring formed thereon, and wherein the wiring comprises:
- a first portion made of a first conductive pattern; and
- a second portion including a second conductive pattern thicker than the first conductive pattern.

14. The method of manufacturing the electronic device according to claim 13, wherein the step (a) includes the steps of:
   - (a1) forming the first conductive pattern over the wiring substrate; and
   - (a2) forming the second conductive pattern in contact with the first conductive pattern.

15. The method of manufacturing the electronic device according to claim 14,
   wherein the step (a1) includes the steps of:
   - (a11) forming a first conductive film over the wiring substrate; and
   - (a12) patterning the first conductive film, and
   wherein the step (a2) includes the steps of:
   - (a21) forming a mask covering the first conductive pattern of the first portion; and
   - (a22) forming the second conductive pattern over the first conductive pattern of the second portion by an electrolyte plating method using the first conductive pattern as a seed layer in a state of formation of the mask.

16. The method of manufacturing the electronic device according to claim 14,
   wherein the step (a1) includes the steps of:
   - (a11) forming a first conductive film over the wiring substrate; and
   - (a12) patterning the first conductive film by a lift-off method, and
   wherein the step (a2) includes the steps of:
   - (a21) forming a second conductive film over the first conductive pattern; and
   - (a22) patterning the second conductive film by a lift-off method.

17. The method of manufacturing the electronic device according to claim 14,
   wherein the step (a1) includes the steps of:
   - (a11) forming a first conductive film over the wiring substrate; and
   - (a12) patterning the first conductive film, and
   wherein the step (a2) includes the steps of:
   - (a21) covering the first conductive pattern and forming a second conductive film over the wiring substrate; and
   - (a22) patterning the second conductive film.

18. The method of manufacturing the electronic device according to claim 14,
   wherein the step (a2) includes the steps of:
   - (a21) forming a second conductive film over the wiring substrate; and
   - (a22) patterning the second conductive film, and
   wherein the step (a1) includes, after the step (a2), the steps of:
   - (a11) covering the second conductive film and forming a first conductive film over the wiring substrate; and
   - (a12) patterning the first conductive film.

* * * * *